(12) United States Patent
Lambert

(10) Patent No.: US 6,724,324 B1
(45) Date of Patent: Apr. 20, 2004

(54) CAPACITIVE PROXIMITY SENSOR

(75) Inventor: David Kay Lambert, Sterling Heights, MI (US)

(73) Assignee: Delphi Technologies, Inc., Troy, MI (US)

( * ) Notice: Subject to any disclaimer, the term of this patent is extended or adjusted under 35 U.S.C. 154(b) by 715 days.

(21) Appl. No.: 09/643,236

(22) Filed: Aug. 21, 2000

(51) Int. Cl.⁷ .................. H03K 17/94; H03M 11/00
(52) U.S. Cl. ................. 341/33; 324/663; 340/562
(58) Field of Search ............ 341/33; 324/658, 324/688, 663, 662; 340/870.37, 562, 561; 345/174

(56) References Cited

U.S. PATENT DOCUMENTS

| | | | |
|---|---|---|---|
| 4,261,440 A | * | 4/1981 | Jacoby .................. 187/48 |
| 4,351,016 A | | 9/1982 | Felbinger |
| 4,410,843 A | | 10/1983 | Sauer et al. |
| 4,453,112 A | | 6/1984 | Sauer et al. |
| 4,458,445 A | | 7/1984 | Sauer et al. |
| 4,831,279 A | | 5/1989 | Ingraham |
| 4,983,896 A | | 1/1991 | Sugiyama et al. |
| 5,027,552 A | | 7/1991 | Miller et al. |
| 5,081,406 A | | 1/1992 | Hughes et al. |
| 5,337,353 A | | 8/1994 | Boie et al. |
| 5,621,290 A | | 4/1997 | Heller et al. |
| 5,726,581 A | | 3/1998 | Vranish |
| 5,767,686 A | * | 6/1998 | Kespohl .................. 324/662 |
| 5,801,340 A | | 9/1998 | Peter |
| 5,914,610 A | * | 6/1999 | Gershenfeld et al. ....... 324/663 |
| 6,229,317 B1 | * | 5/2001 | Barchuk .................. 324/663 |
| 6,348,862 B1 | * | 2/2002 | McDonnell et al. ........ 340/562 |
| 6,469,524 B1 | * | 10/2002 | Oberdier .................. 324/688 |

OTHER PUBLICATIONS

Baxter, Larry. *Capacitive Sensors Design and Applications* (pp. 236–242 & 271–277) IEEE Press Marketing; 1997 by the Institute of Electrical and Electronics, Inc.

* cited by examiner

*Primary Examiner*—Timothy Edwards
(74) *Attorney, Agent, or Firm*—Scott A. McBain

(57) ABSTRACT

A capacitive sensor including a first electrode that has at least one conducting surface being disposed for receiving an alternating current signal, and a second electrode that has at least one conducting surface being disposed to generate an input signal for a detecting device. The sensor further includes a middle electrode that has at least one conducting surface placed between the first electrode and the second electrode, as well as being grounded to a ground. The at least one conducting surface of the middle electrode, the at least one conducting surface of the first electrode, and the at least one conducting surface of the second electrode are contained within a holding material holding within itself the first electrode, the second electrode and the middle electrode.

18 Claims, 18 Drawing Sheets

SENSITIVE VOLUME

CAPACITIVE PROXIMITY SENSOR

TECHNICAL FIELD

This invention relates to sensors, and more particularly, to capacitive proximity sensors.

BACKGROUND OF THE INVENTION

Capacitive sensors using a single plate capacitive proximity detector are known. The publication entitled: Capacitive Sensors-Design and Applications (ISBN#0-7803-5351-X) by Larry K. Baxter, 1st ed. (IEEE, Piscataway, N.J., 1997) describes one known capacitive proximity sensing system. Typically, a balance is achieved such that the system is stable. The balance is disrupted, for example, when a third object projects itself into the system, thereby altering a previous capacitance. The net result is a disruption of the balance. The balance can be achieved by using a bridge circuit with the proximity detecting capacitor in one arm of the bridge and a second capacitor, that has been adjusted to null the output of the bridge, in the other arm. Alternatively, the system can consist of two virtually identical oscillators that are independent of each other. Each of the two identical oscillators generates a signal with a frequency, dependent on a capacitance, that is virtually identical to the other oscillator. Thus, when one capacitance is changed, the balance between the two frequencies is disrupted and the disruption can be measured, for example, by way of an electronic device.

To understand the instant invention, some related background is necessary. Capacitance is the linear coefficient that relates the charge induced on one electrode to the potential applied to a different electrode. There is also self-capacitance that relates to the charge on an electrode to its own potential. For example, consider a situation with N electrodes, all electrically isolated from one another. Electrode i has charge $Q_i$ and potential $V_i$. The charge on electrode i can be expressed as:

$$Q_i = \sum_{j=1}^{N} C_{ji} V_j. \quad (1)$$

Here, $C_{ji}$ is the capacitance of electrode i with respect to electrode j. Given the geometry, the capacitance can be calculated. In electrostatics it is known that for any geometry, $C_{ji} = C_{ij}$.

SUMMARY OF THE INVENTION

One embodiment of the invention is a capacitive sensor which includes a first electrode that has at least one conducting surface being disposed for receiving an alternating current signal, and a second electrode that has at least one conducting surface being disposed to generate an input signal for a detecting device. The sensor further includes a middle electrode that has at least one conducting surface placed between the first electrode and the second electrode, as well as being grounded to a ground. The at least one conducting surface of the middle electrode, the at least one conducting surface of the first electrode, and the at least one conducting surface of the second electrode being contained within a dielectric material holding within itself the first electrode, the second electrode and the middle electrode.

Another embodiment of the invention is a capacitive proximity sensing system which includes a first electrode that has at least one conducting surface being disposed for receiving an alternating current signal, and a second electrode that has at least one conducting surface being disposed to generate an input signal. The sensing system further includes a middle electrode that has at least one conducting surface placed between the first electrode and the second electrode, as well as being grounded to a ground. The at least one conducting surface of the middle electrode, the at least one conducting surface of the first electrode, and the at least one conducting surface of the second electrode being contained within a dielectric material holding within itself the first electrode, the second electrode and the middle electrode. The sensing system also includes an oscillator coupled to the first electrode generating the alternating current signal, and a detector that receives the input signal. An output of the detector is representative of the capacitance between the first electrode and the second electrode. Other detection methods known in the art may be used in place of the synchronous detector, such as envelope detection.

BRIEF DESCRIPTION OF THE DRAWINGS

The present invention will now be described, by way of an example, with references to the accompanying drawings, in which.

DESCRIPTION OF THE PREFERRED EMBODIMENT

Figure 1:
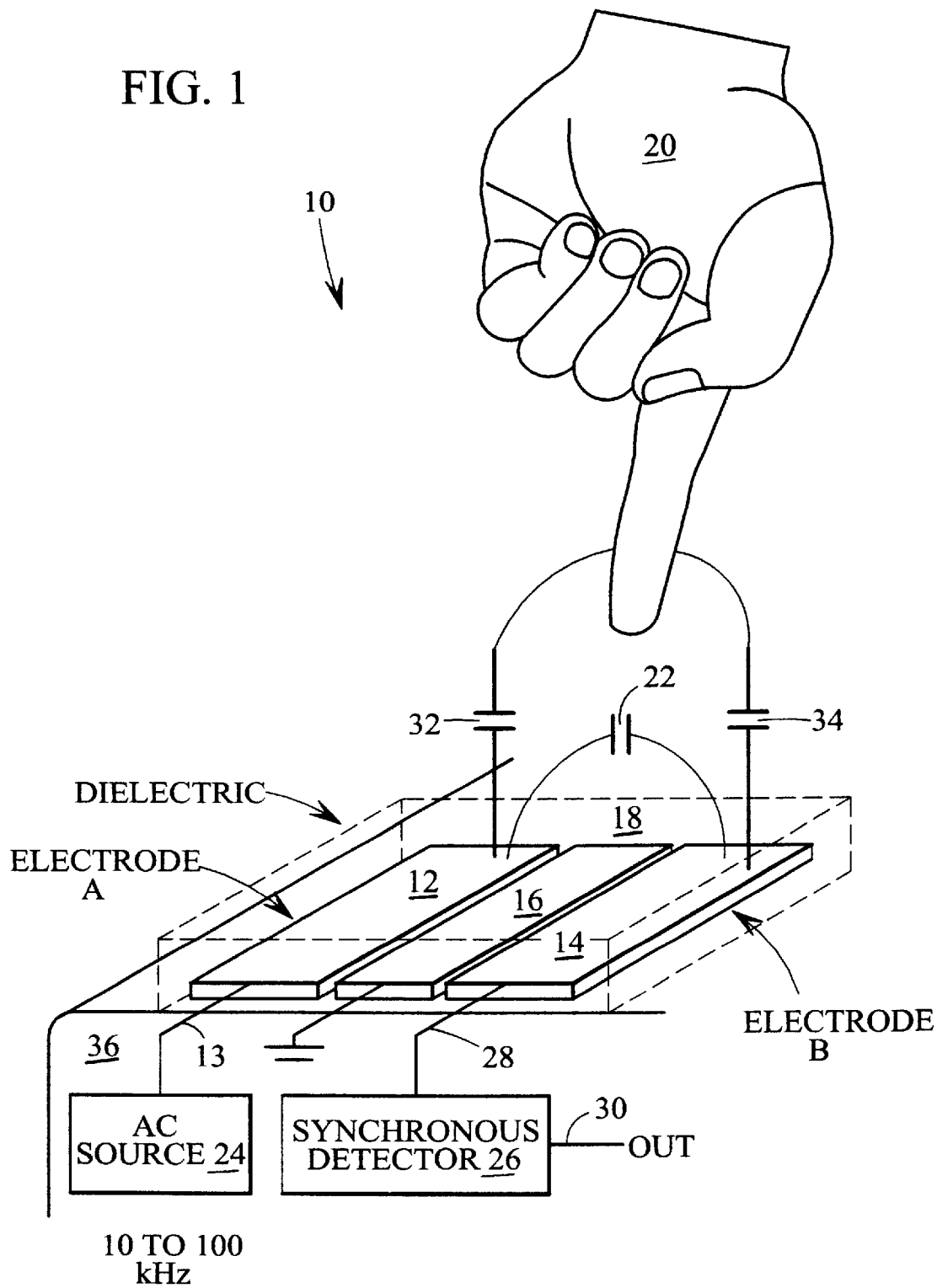
FIG. 1 is a schematic illustration of a proximity sensor based on capacitance.
Figure 1A:
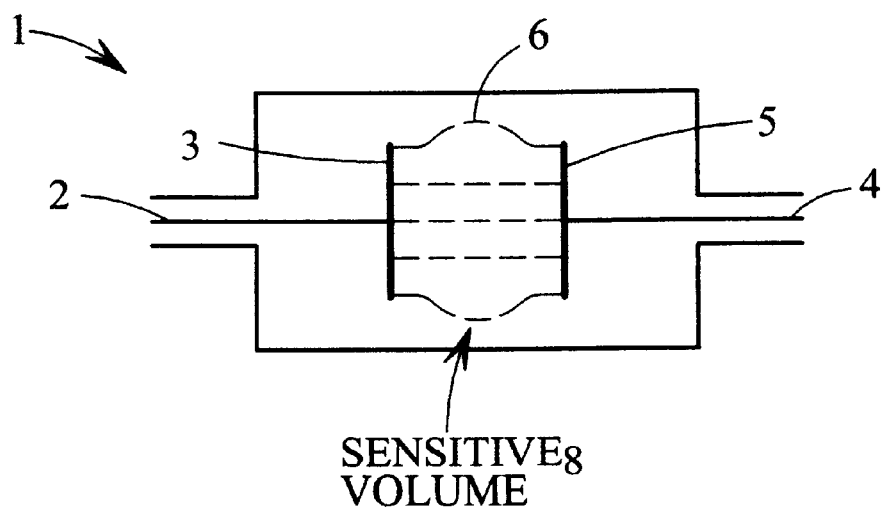
FIG. 1A is an electrode configuration with desirable properties for a capacitive sensor.

An electrode configuration with desirable properties for a capacitive sensor 1 as shown in FIG. 1A is described. This electrode configuration is referred to as a three-terminal capacitor or as a capacitive sensor with two-ports. Here, the capacitance between port 2 and port 4 depends only on the electric field lines 6 connecting the corresponding two electrodes, 3 and 5. It is noted that the sensitive volume 8 is localized between these electrodes. A change in geometry that occurs elsewhere, such as a change in the length of one of the cables going to either port 2 or port 4, has no effect on a measured capacitance. By choosing the appropriate electrode geometry, the sensor's sensitivity to a quantity of interest is optimized, but sensitivity is minimized for other variables that should not change the measurement.

Figure 12:
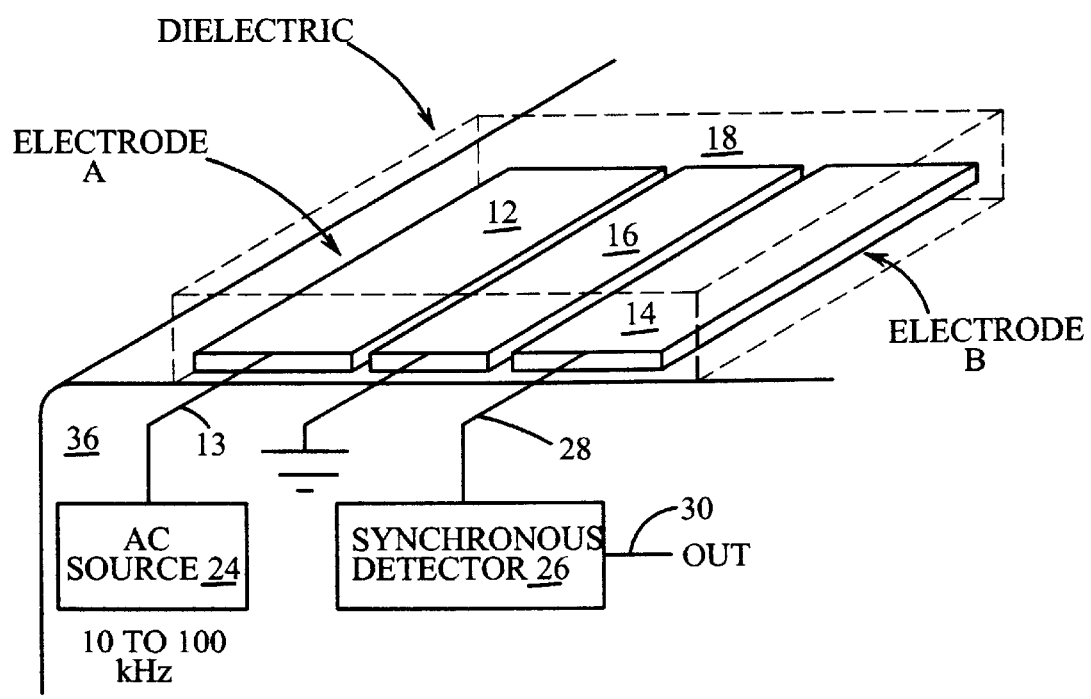
FIG. 12 shows a capacitive sensor for an embodiment of the invention.

An exemplary capacitive sensor 10 is shown in FIGS. 1 and 12. It consists of two parallel electrode strips, 12 and 14, with a grounded strip 16 between them, and in certain applications with a grounded metal surface 36 (e.g. a vehicle body plate) beneath them. The electrode strips 12, 14, 16 are covered with a holding material, such as a layer of dielectric, 18 holding the electrodes 12, 14, 16 therein. The measured capacitance $C_{AB}$ 22 between strips 12 and 14 changes as a foreign object such as a person's hand 20 approaches the electrodes.

Figure 5:
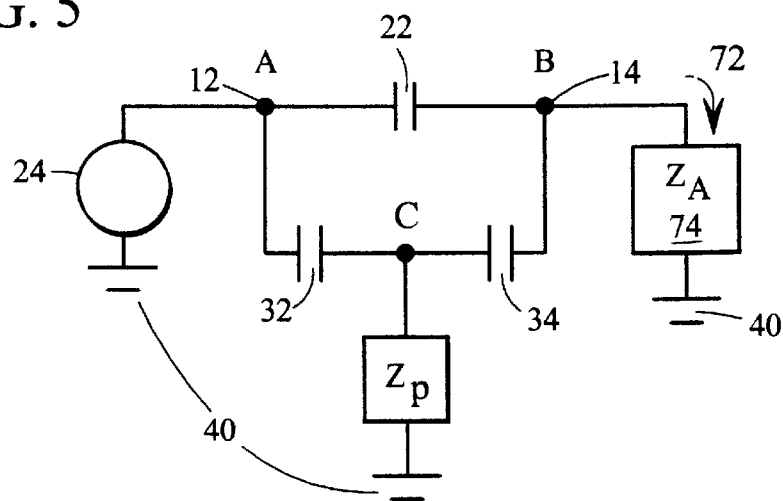
FIG. 5 is an idealized model for analyzing an embodiment of the invention including its concomitant capacitances.

An equivalent circuit, used to analyze the effect of a hand near the sensor, is shown in FIG. 5. At low frequencies, the human body behaves electrically like salt water (the blood), which is a good electrical conductor that is inside a resistive container (the skin). The resistance between two electrodes immersed in body fluids is typically on the order of 100Ω. The resistance between two metal electrodes, each 1 cm$^2$ in area, on dry skin, is typically 100 kΩ. When the skin is moist, the resistance can drop to 2 kΩ. Consequently, at low frequencies, the outside of the body can be described as an approximately constant potential surface—as if it were covered with metal. The body has capacitance to ground, to electrode A, and to electrode B. The capacitance of the body to ground is typically on the order of 250 pF.

When a person's hand 20 approaches the sensitive strip, two things happen. One is that $C_{AB}$ 22, the direct capacitance from electrode 12 to electrode 14, decreases. The hand acts like a grounded metal plate that prevents field lines from getting from 12 to 14. This causes the measured capacitance to decrease as a person approaches, as long as they do not get too close. The holding material 18 makes sure that the hand 20 does not get too close to the capacitive sensor.

In addition, $C_{AC}$ 32 and $C_{CB}$ 34, the capacitances between the hand and each of the two electrodes, increase. As the hand approaches the electrodes 12 and 14, this causes alternating current (AC) to flow from electrode 12 to the area of the hand 20 near electrode 12, through the hand 20, and then from the area of the hand near electrode 14 to electrode 14. When the hand 20 approaches very close, this causes the measured capacitance 22 from electrode 12 to electrode 14 to begin to increase again as the hand approaches the sensitive strip. If the holding material 18 over the electrodes is thick enough, the hand 20 is prevented from getting close enough to the electrodes 12 and 14 for the resultant "too close" effect to be a problem.

It is noted that at high frequencies, for example, at a frequency in the range of 100 to 900 MHz, the electric field is better able to penetrate into the body. For seawater, the exponential decay length of incident electromagnetic waves is 1.2 cm and 0.4 cm at 100 MHz and at 900 MHz, respectively. The decay length on going into the body is similar. Consequently, the electric field penetrates to the center of a finger at high frequencies, and much of the effect comes from the dielectric constant of the body being much larger than that of air. This is not suitable for the present invention. In the present invention, the electric field does not penetrate into the body much past the skin. Also, at the higher frequencies, the corresponding wavelength is comparable with the length of the electrode, making wave effects like reflection from the end of the electrode important, while wave effects are not important for the sensor described in the instant invention. For example, at 400 MHz the wavelength is 75 cm, but at 100 kHz the wavelength is 3 km. By choosing operating frequency range between 10–100 KHz, the above described undesirable effects are avoided. In other words, by utilizing a low frequency range, the undesirable high frequency complications described above are averted. Also electromagnetic interference is reduced at the lower frequencies.

Referring to FIG. 1, reference numeral 10 denotes a schematic illustration of a capacitive proximity sensor. There are two parallel electrodes, a first electrode 12, and a second electrode 14, with a grounded electrode 16 between the first electrode 12 and the second electrode 14. A holding material 18 above the electrodes, i.e., the first electrode 12, and the second electrode 14, as well as the grounded electrode 16, keeps a hand 20 that is moving above the electrodes 12, 14 and 16 at least a minimum distance above the electrodes 12, 14 and 16. A desired capacitance $C_{AB}$ 22 is measured by applying a sinusoidal potential generated by a device such as alternating current (AC) source 24 to one electrode, for example the first electrode 12 via line 13, and synchronously detecting current flow from electrode 14 to a virtual ground (not shown here). A device such as a synchronous detector 26 is used to detect the capacitance $C_{AB}$ 22 or a derivative thereof, and filter out noise at undesirable frequencies. The synchronous detector 26 detects a change in measured capacitance by way of line 28 that is coupled to capacitance $C_{AB}$ 22 and is used to detect proximity of an object such as the hand 20. A parameter 30 indicative of the measured capacitance is output by the synchronous detector 26.

As can be appreciated, a capacitance $C_{AC}$ 32 that represents the capacitance between the first electrode 12 and the hand 20 exists. Similarly, a capacitance $C_{CB}$ 34 that represents the capacitance between the second electrode 14 and the hand 20 exists as well.

Furthermore, the frequency of the sinusoidal potential source 24 applied to electrode 12 is typically in the range 10–100 kHz or in the neighborhood thereof, but a much broader range frequencies such as 1 kHz to 1 MHz, and extending up to even higher frequencies, could also be used within the scope of the invention. Also, in some applications of the invention, the proximity sensor 10 is mounted on a base that is an electric conductor. For example, the three terminal sensor may be mounted on a motorized sliding side door or around the perimeter of motorized rear hatch of a vehicle with a grounded metal body.

Figure 2:
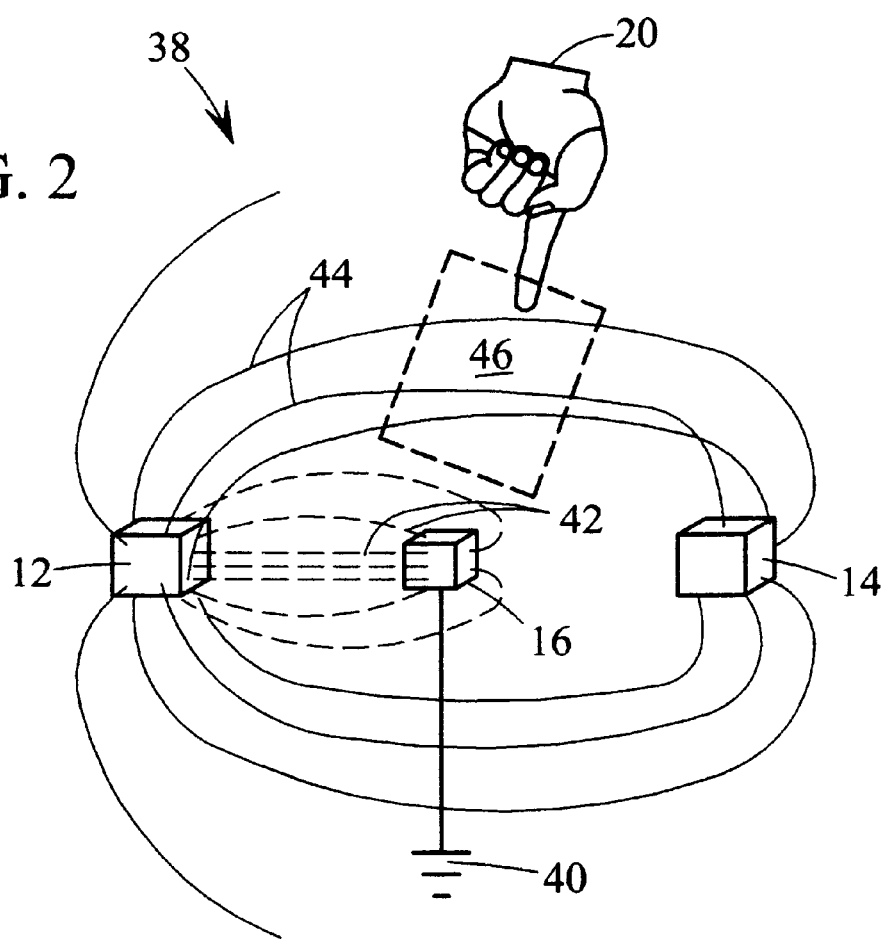
FIG. 2 depicts a generic rendition of one embodiment of the invention.
Figure 2A:
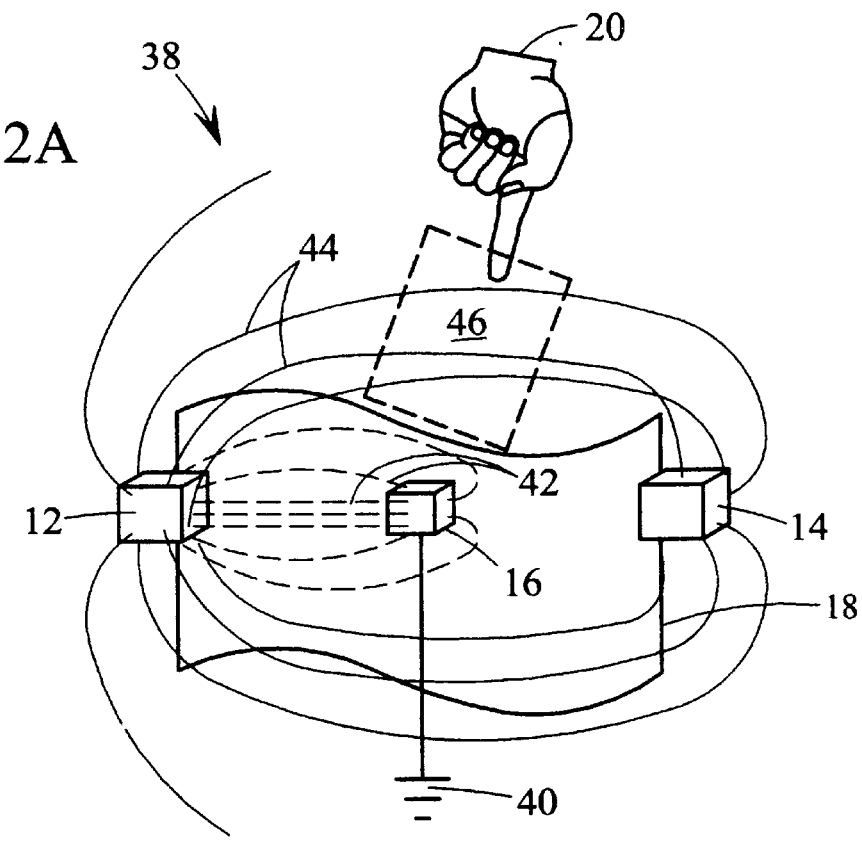
FIG. 2A is a drawing depicting an introduction of dielectric material to that of FIG. 2.

Referring to FIGS. 2 and 2A, a generic rendition 38 of an embodiment of the invention is shown. The first electrode 12, and the second electrode 14 can be of various suitable shapes. The same is true for the grounded electrode 16, which is connected to ground 40. An electric field is generated by applying the alternating current (AC) source 24 to the first electrode 12. The electric field has two spatial components. Namely, a first component, which includes flux lines 42 that pass between the first electrode 12 and the grounded electrode 16 and a second component, which includes the remaining flux lines 44 that pass between the first electrode 12 and the second electrode 14. It can be appreciated that the overall capacitance between electrodes 12 and 14 is decreased because of the introduction of the grounded electrode 16. However, as described herein, a desirous outcome is achieved because of the structure. In other words, when the hand 20 enters into the remaining field 44, for example, into a region such as a cube 46, the desirous outcome occurs as compared with a structure wherein the grounded electrode 16 does not exist.

In FIG. 2A, the holding material 18 is introduced such that the holding material 18 wraps around the first electrode 12, the second electrode 14, as well as the grounded electrode 16. The holding material 18 may be chosen to have a dielectric constant greater than that of the air at suitable frequencies. Furthermore, in FIG. 2A, the electric field lines 42 and 44 do not reflect the effect of the holding material 18. In other words, the electric field lines 42 and 44 bend according to relevant laws of physics. FIG. 2A is structurally identical with FIG. 2 with the only exception that the holding material 18 is introduced to wrap around the first electrode 12, the second electrode 14, as well as the grounded electrode 16.

Referring to FIGS. 3–10, a two-dimensional model of an electrode that is representative of an embodiment of the invention is provided. This model is used to calculate the capacitances between electrodes 48, 50 and 52 in an idealized geometry. Electrode 48 can be an equivalent of the first electrode 12 of FIGS. 1 and 2. Electrode 50 can be an equivalent of the second electrode 14 of FIGS. 1 and 2. Furthermore, electrode 52 can be an equivalent of the hand 20 of FIGS. 1 and 2. This model is used to understand how to design the sensor electrodes for optimum performance.

Figure 4:
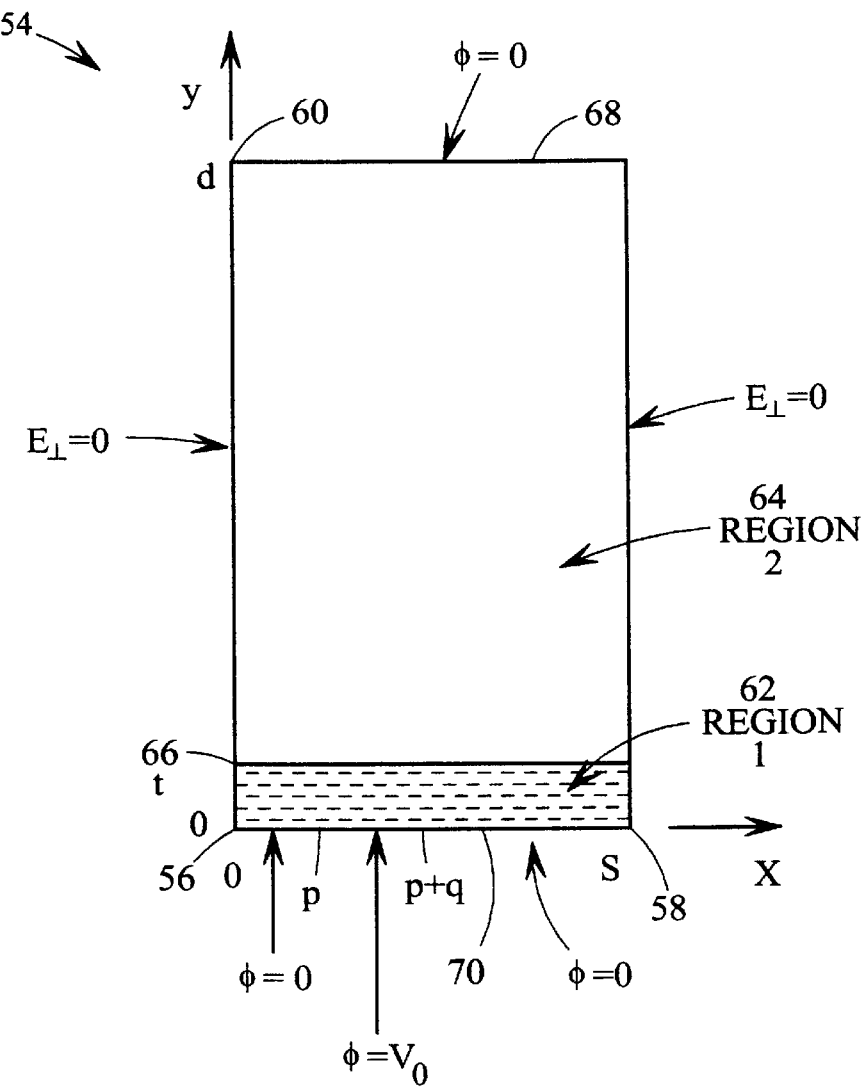
FIG. 4 is an idealized model for analyzing an embodiment of the invention including a dielectric layer.

A rectangular two-dimensional geometry 54 used for the model is shown in FIG. 4. It is a cross-section of the electrodes, extending from a point 56 to a point 58, and from the point 56 to point 60. In other words, from 0 to s in the x-direction and from 0 to d in the y-direction. The electrodes extend a distance L in the z-direction (not shown). Edge effects (also not shown) in the z-direction are assumed to be negligible.

As shown in FIG. 4, there are two regions i.e., region 62 and region 64. Region 62 is a dielectric of thickness t 66 with dielectric constant $\epsilon_r$. Region 64 is air with dielectric constant of approximately 1. There is a top plate 68 at y=d that is held at ground potential, $\phi=0$. There is also a bottom plate 70, at y=0, that is also held at ground potential except for p<x<p+q, where $\phi=V_0$. Along the sides of the volume, at x=0 and at x=s, the electric field component is perpendicular to the side, $E_\perp=0$. This boundary condition is chosen to approximate the actual situation; it would be exact if the region were repeated by reflecting about x=0 and x=s. It is also a good approximation if d/p<0.5, so edge effects occur mainly within the region included in the calculation.

To calculate $C_{AB}=Q_B/V_0$, the charge density on the bottom plate 70 is determined, and integrated over the region occupied by electrode B: from s−(p+q) to s−p. To calculate $C_{AC}=Q_C/V_0$, the charge density on the top plate is determined and integrated over the top plate. It is known in the art that, by symmetry $C_{AC}=C_{BC}$.

There are two sign conventions used to describe capacitance. In the convention used in Equation 1, the capacitance $C_{ij}$ between two conductors is always negative since the application of a positive potential on a conductor always induces negative charge on a nearby conductor. However, as a circuit element, capacitance is always described as a positive quantity. In what follows, the circuit element convention is used so $C_{AB}=-Q_B/V_0$ and $C_{AC}=-Q_C/V_0$.

Figure 3:
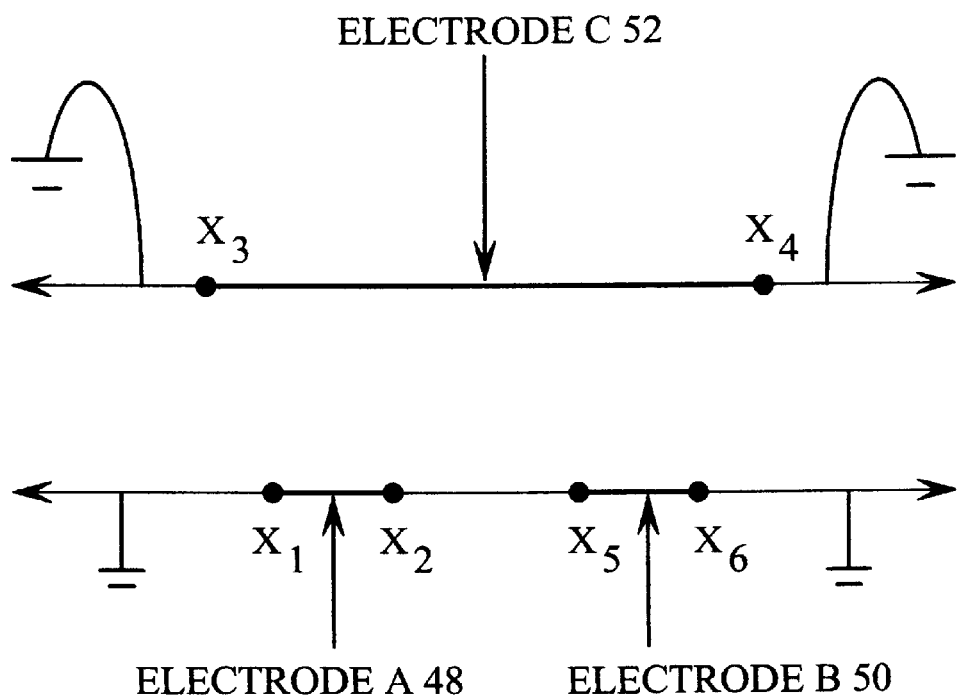
FIG. 3 is an idealized model for analyzing an embodiment of the invention.

Before solving for the capacitances in the geometry of FIG. 4, it is noted that if the top plate 68 and bottom plate 70 are of infinite horizontal extent in the plane, as shown in FIG. 3, with a dielectric of dielectric constant $\epsilon$, between them, and if the plates have length L, there are simple analytic expressions for $C_{AB}$ and $C_{AC}$:

$$C_{AB} = \frac{\epsilon_0 \epsilon_r L}{\pi} \ln \left\{ \frac{\sinh[\frac{\pi}{2d}(x_1-x_5)]\sinh[\frac{\pi}{2d}(x_2-x_6)]}{\sinh[\frac{\pi}{2d}(x_2-x_5)]\sinh[\frac{\pi}{2d}(x_1-x_6)]} \right\}, \quad (2)$$

$$C_{AC} = \frac{\epsilon_0 \epsilon_r L}{\pi} \ln \left\{ \frac{\cosh[\frac{\pi}{2d}(x_4-x_1)]\cosh[\frac{\pi}{2d}(x_3-x_2)]}{\cosh[\frac{\pi}{2d}(x_3-x_1)]\cosh[\frac{\pi}{2d}(x_4-x_2)]} \right\}. \quad (3)$$

Returning to the geometry of FIG. 4, within region 62 and region 64 the electrostatic potential $\Omega$ obeys the Laplace equation:

$$\frac{\partial^2 \phi}{\partial x^2} + \frac{\partial^2 \phi}{\partial y^2} = 0. \quad (4)$$

At the boundary between region 62 and region 64 or y=t, both the component of D normal or perpendicular to the surface and the component of E parallel or horizontal to the interface are continuous.

First, consider a simplified situation in which the entire bottom plate is at potential $V_0$. The boundary conditions are satisfied if D=$D_0$ y where $D_0$ is a constant and y is the unit vector in the y-direction. Consequently, within regions 1 and 2, the electric field is respectively:

$$E_1 = D_0/\epsilon_r, \quad (5)$$

$$E_2 = D_0. \quad (6)$$

The potential difference between the top and the bottom is defined as the line integral of E between them so $$V_0 = D_0 \left( \frac{t}{\epsilon_r} + d - t \right). \quad (7)$$

on sequently, the boundary conditions are satisfied if, within regions 1 and 2, the electrostatic potential is $$\phi_1 = V_0 \frac{[\epsilon_r d - t(\epsilon_r - 1)] - y}{\epsilon_r d - t(\epsilon_r - 1)}, \quad (8)$$

$$\phi_2 = V_0 \frac{\epsilon_r(d - y)}{\epsilon_r d - t(\epsilon_r - 1)}. \quad (9)$$

Now consider the situation shown in FIG. 4 without simplifying assumptions. The electrostatic potential is solved by using a complete set of solutions to Eq. (4) to match the boundary conditions.

In region 1:

$$\phi^{(1)} = A_0 \frac{[\varepsilon_r d - t(\varepsilon_r - 1)] - y}{\varepsilon_r d - t(\varepsilon_r - 1)} + \sum_{n=1}^{\infty} \cos\left(\frac{n\pi}{s}x\right)\left[A_n \exp\left(\frac{n\pi}{s}y\right) + B_n \exp\left(\frac{-n\pi}{s}y\right)\right].$$ (10)

In region 2:

$$\phi^{(2)} = A_0 \frac{\varepsilon_r(d-y)}{\varepsilon_r d - t(\varepsilon_r - 1)} + \sum_{n=1}^{\infty} \cos\left(\frac{n\pi}{s}x\right)\left[G_n \exp\left(\frac{n\pi}{s}y\right) + H_n \exp\left(\frac{-n\pi}{s}y\right)\right].$$ (11)

At $y=0$, $\Omega V_0$ for $p<x<p+q$, otherwise $\Omega_{(1)}=0$. Consequently, for $n>0$, $$\int_0^s \phi^{(1)} \cos\left(\frac{n\pi}{s}x\right) dx = \int_p^{p+q} V_0 \cos\left(\frac{n\pi}{s}x\right) dx = \frac{V_0 s}{n\pi}\left\{\sin\left[\frac{n\pi(p+q)}{s}\right] - \sin\left(\frac{n\pi p}{s}\right)\right\},$$ (12)

$$\int_0^s \phi^{(1)} \cos\left(\frac{n\pi}{s}x\right) dx = \int_0^s \cos\left(\frac{n\pi}{s}x\right)(A_n + B_n)\cos\left(\frac{n\pi}{s}x\right) dx = \frac{s}{2}(A_n + B_n).$$ (13)

Thus, the boundary condition at $y=0$ implies that $$A_n + B_n = \frac{2V_0}{n}\left\{\sin\left[\frac{n\pi}{s}(p+q)\right] - \sin\left(\frac{n\pi}{s}p\right)\right\}.$$ (14)

To obtain $A_0$, $\int_0^s \phi^{(1)} dx = \int_0^s A_0 dx,$ (15)

Thus, $A_0 = V_0 q/s.$ (16)

At $y=t$, the boundary conditions for the normal or perpendicular component of D and the parallel or horizontal component of E are:

$$\varepsilon_r \frac{\partial \phi^{(1)}}{\partial y} = \frac{\partial \phi^{(2)}}{\partial y},$$ (17)

$$\frac{\partial \phi^{(1)}}{\partial x} = \frac{\partial \phi^{(2)}}{\partial x}.$$ (18)

To be satisfied, these must be true for each function in the set:

$$\varepsilon_r A_n \exp\left(\frac{n\pi t}{s}\right) - \varepsilon_r B_n \exp\left(\frac{-n\pi t}{s}\right) - G_n \exp\left(\frac{n\pi t}{s}\right) + H_n \exp\left(\frac{-n\pi t}{s}\right) = 0,$$ (19)

$$A_n \exp\left(\frac{n\pi t}{s}\right) + B_n \exp\left(\frac{-n\pi t}{s}\right) - G_n \exp\left(\frac{n\pi t}{s}\right) - H_n \exp\left(\frac{-n\pi t}{s}\right) = 0.$$ (20)

Also, since $\phi = 0$ at $y = d$, $G_n \exp\left(\frac{n\pi d}{s}\right) + H_n \exp\left(\frac{-n\pi d}{s}\right) = 0.$ (21)

For a particular $n>0$, the potential in the two regions is determined by $A_n$, $B_n$, $G_n$, and $H_n$. There are four linear equations for these unknowns: Eqs. (14), (19), (20), and (21). The solution, obtained by matrix inversion, is:

$$A_n = \frac{k_n[\varepsilon_r(\gamma_n - B_n) - (\gamma_n + B_n)]}{\varepsilon_r(\gamma_n - B_n)(B_n + 1) + (\gamma_n + B_n)(B_n - 1)},$$ (22)

$$B_n = \frac{k_n B_n[\varepsilon_r(\gamma_n - B_n) + (\gamma_n + B_n)]}{\varepsilon_r(\gamma_n - B_n)(B_n + 1) + (\gamma_n + B_n)(B_n - 1)},$$ (23)

$$G_n = \frac{-2k_n \varepsilon_r B_n}{\varepsilon_r(\gamma_n - B_n)(B_n + 1) + (\gamma_n + B_n)(B_n - 1)},$$ (24)

$$H_n = \frac{2k_n B_n \gamma_n}{\varepsilon_r(\gamma_n - B_n)(B_n + 1) + (\gamma_n + B_n)(B_n - 1)}, \text{ where}$$ (25)

$$k_n = \frac{2V_0}{n\pi}\left\{\sin\left[\frac{n\pi}{s}(p+q)\right] - \sin\left(\frac{n\pi}{s}p\right)\right\},$$ (26)

$$B_n = \exp\left(\frac{2n\pi t}{s}\right),$$ (27)

$$\gamma_n = \exp\left(\frac{2n\pi d}{s}\right).$$ (28)

To determine $Q_B$, use the charge density on the bottom plate $$q_{bot}(x) = -\varepsilon_r \varepsilon_0 \frac{\partial \phi^{(1)}}{\partial y} L.$$ (29)

Consequently, $$C_{AB} = -\frac{Q_B}{V_0} = -\frac{1}{V_0}\int_{s-(p+q)}^{s-p} \rho_{bot} dx,$$ (30)

$$= -\varepsilon_0 \varepsilon_r L\left\{\frac{q^2}{s[\varepsilon_r d - t(\varepsilon_r - 1)]} + \frac{2}{\pi}\sum_{n=1}^{\infty}\frac{\lambda_n[\varepsilon_r(\gamma_n - B_n)(B_n - 1) + (\gamma_n + B_n)(B_n + 1)]}{n[\varepsilon_r(\gamma_n - B_n)(B_n + 1) + (\gamma_n + B_n)(B_n - 1)]}\right\}, \text{ where}$$

$$\lambda_n = \left\{\sin\left[\frac{n\pi(s-p)}{s}\right] - \sin\left[\frac{n\pi(s-p-q)}{s}\right]\right\}\left\{\sin\left[\frac{n\pi(p+q)}{s}\right] - \sin\left[\frac{n\pi p}{s}\right]\right\}.$$ (31)

To determine $Q_C$ use the charge density on the top plate $$q(x) = \varepsilon_0 \frac{\partial \phi^{(2)}}{\partial y} L.$$ (32)

Consequently, $C_{AC} = -\frac{Q_C}{V_0} = -\frac{1}{V_0}\int_0^s \rho_{top} dx,$ (33)

$$= \frac{\varepsilon_0 \varepsilon_r L q}{\varepsilon_r d - t(\varepsilon_r - 1)}.$$

The quantity of interest is actually a current 72 measured by the capacitive sensor such as the schematic illustration of a proximity sensor shown in FIG. 5. In other words, the current 72 is from electrode 14 through $Z_A$ 74 to ground, in FIG. 5. The potential applied to electrode 12 is $V_0$ Re[exp (jωt)], where ω=2πf, with f the frequency within the range described above. In the approximation that $Z_A$ 74 is negligible, this current is $$i = V_0 \frac{Z_p(Z_{BC} + Z_{AC} + Z_{AB})}{Z_{AC}Z_{AB}Z_{BC} + Z_p Z_{AB}Z_{BC} + Z_{AC}Z_p Z_{AB}}. \quad (34)$$

Here, $$Z_{AB}=1/(j\omega C_{AB}),$$
$$Z_{AC}=1/(j\omega C_{AC}),$$
$$Z_{BC}=1/(j\omega C_{BC}). \quad (35)$$

The current that is in phase with the applied voltage is the real part of i; the out-of-phase current is the imaginary part of i.

To understand how the electrode dimensions affects the sensor's performance, the model has been used to calculate their effect on capacitances $C_{AB}$ 22, $C_{AC}$ 32, and the sensor response $|i|/V_0$, as a function of d, the distance between the sense electrodes and the grounded counter electrode that mimics a person. For the calculation the capacitance of the person to ground 40 is taken to be 250 pF, and the sensor frequency f=10 kHz.

Figure 6:
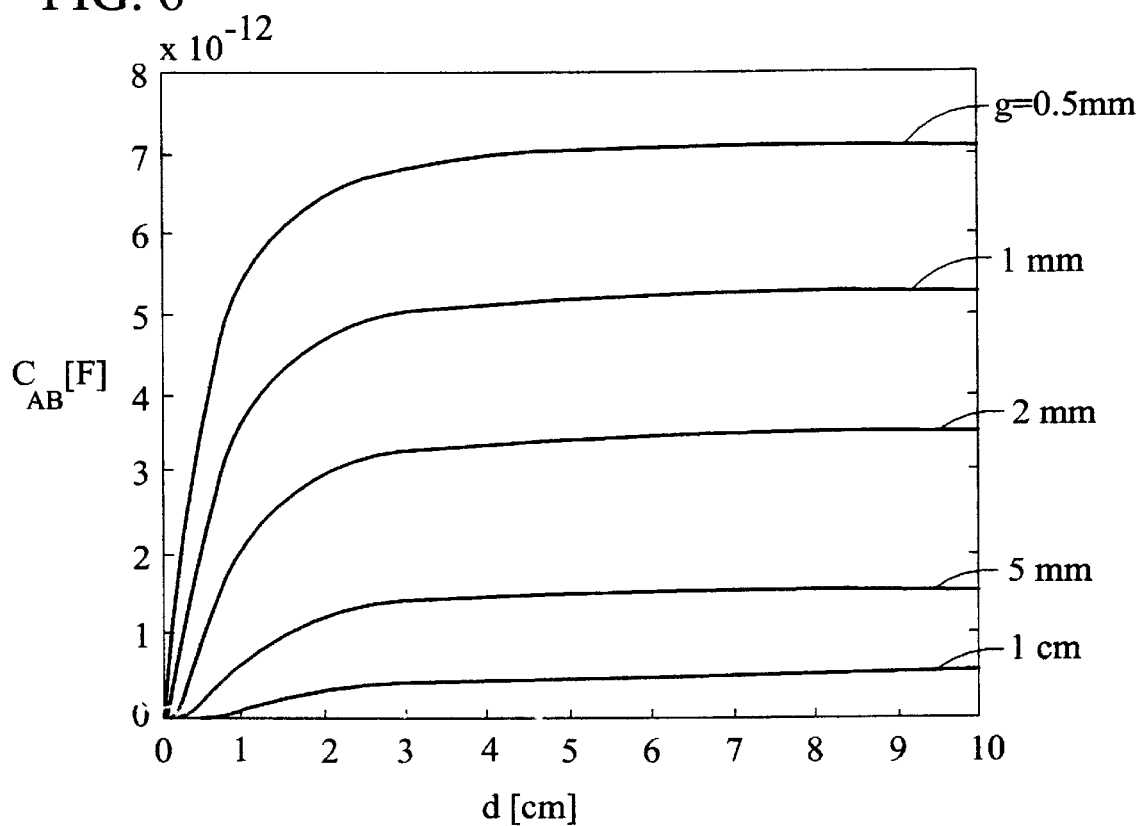
FIG. 6 shows a capacitance $C_{AB}$ as a function of d.
Figure 7:
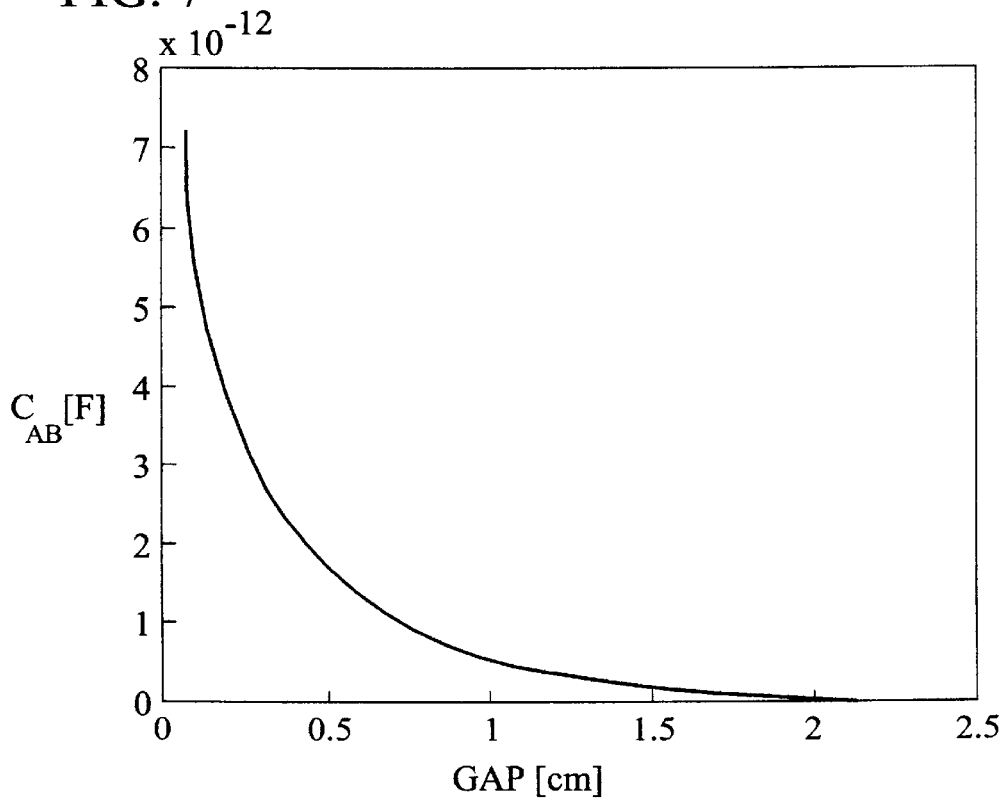
FIG. 7 shows the dependence of the plateau value ($C_{AB}$ at d=10 cm) on the gap g.

As a first example, consider a situation with no dielectric layer, where for a given total width of the bottom electrode the only adjustable parameter is the gap between the two electrodes. Eqs. (2) and (3) are used to obtain capacitance $C_{AB}$ 22 and $C_{AC}$ 32. With fixed total width s=$|x_6-x_1|$=2.5 cm for the bottom electrodes, the effect of the gap g=$|x_5-x_2|$ on capacitance $C_{AB}$ 22 as a function of d is shown in FIG. 6. In other words, capacitance $C_{AB}$ is calculated from Eq. (2) as a function of d, the height of the grounded counter electrode above the sense electrodes, for gap g=0.05, 0.1, 0.2, 0.5, and 1 cm respectively. In each case, the total width s=$|x_6-x_1|$ of the sense electrodes is 2.5 cm. As a function d, it is small in the range 0<d<g/2. It then increases to plateau at d≈s. The dependence of the plateau value ($C_{AB}$ at d=10 cm) on the gap g is shown in FIG. 7. In other words, capacitance $C_{AB}$ is calculated from Eq. (2) as a function of g, the gap between the sense electrodes. The total width of the sense electrodes is fixed at 2.5 cm, and the distance of the grounded counter electrode above the sense electrodes is fixed at 10 cm.

Figure 8:
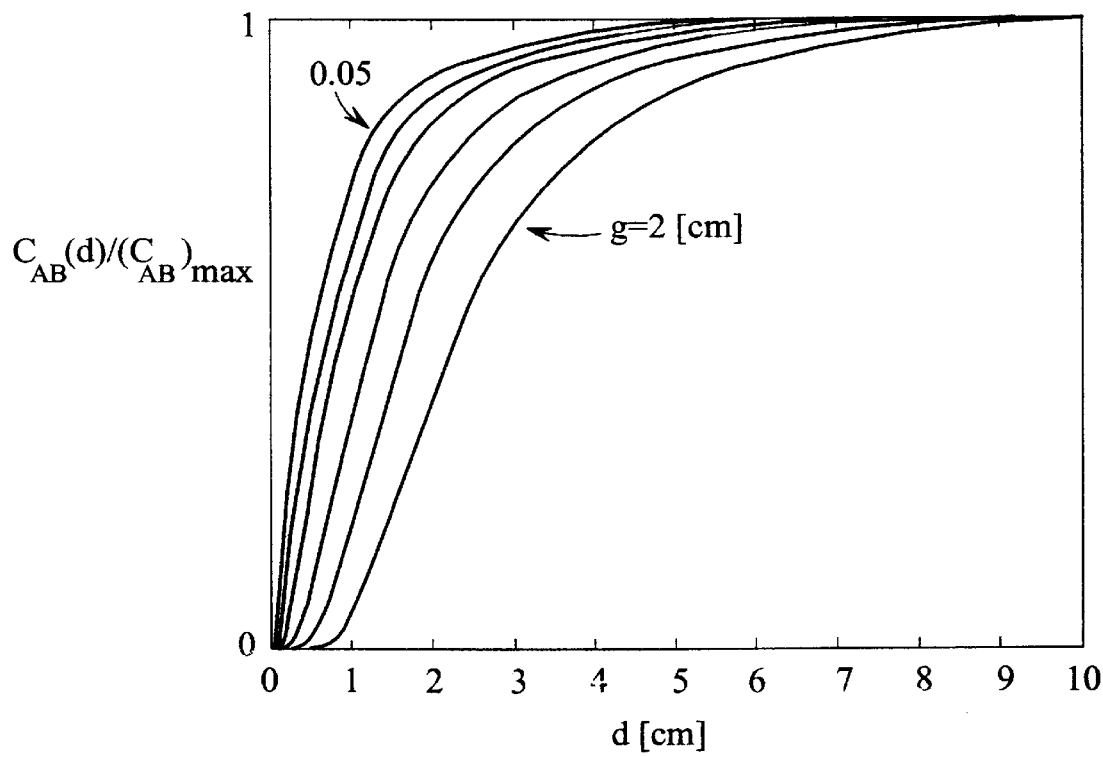
FIG. 8 depicts a relative change in capacitance that is increased by introducing a grounded electrode.

At a given d, capacitance $C_{AB}$ 22 increases as g becomes smaller since electrodes 12 and 14 are brought closer together, allowing more charge to build up. However, as shown in FIG. 8, the relative change in capacitance has just the opposite dependence on g. As g increases, the fractional change in capacitance responds to d farther away. As expected, as the electrodes move further apart, the important field lines move further away from the plane. In other words, $C_{AB}(d)/(C_{AB})_{max}$ is calculated. Note the dependence of the relative change in capacitance on d, for gap g=0.05, 0.1, 0.2, 0.5, 1, and 2 cm respectively. In each case, the total width s=$|x_6-x_1|$ of the sense electrodes is 2.5 cm.

Figure 9:
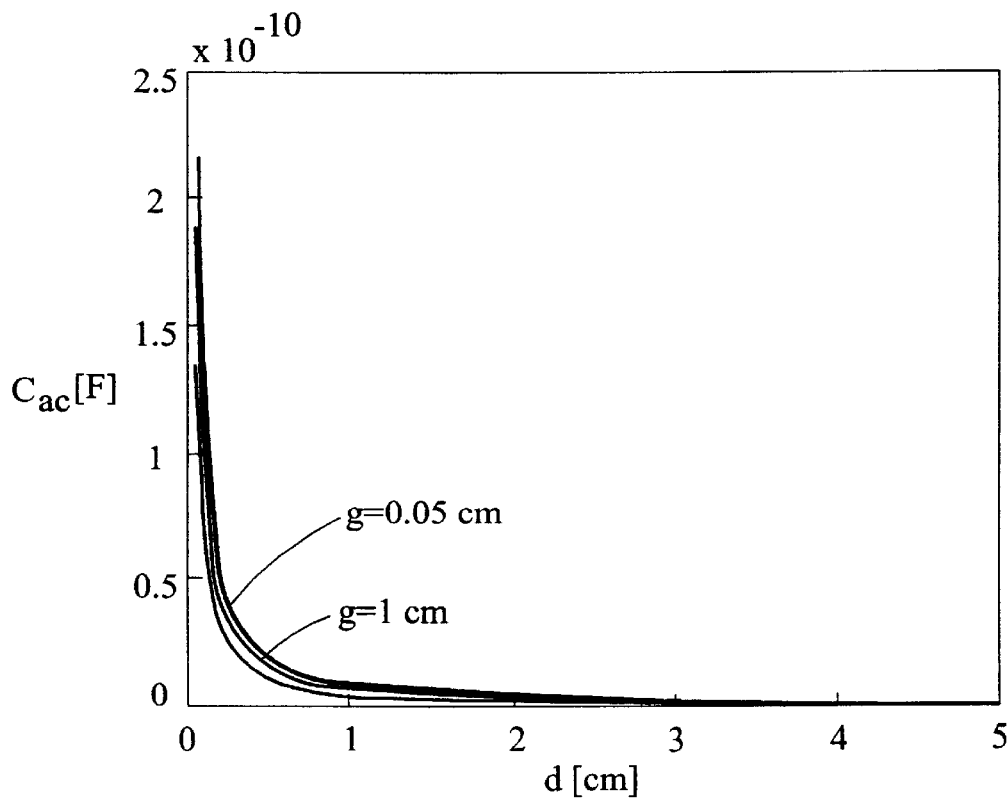
FIG. 9 shows a capacitance $C_{AC}$ as a function of d for various values of g.

Similarly, FIG. 9 shows capacitance $C_{AC}$ 32 as a function of d for various values of g. Capacitance $C_{AC}$ is calculated from Eq. (3) as a function of d, for gap g=0.05, 0.1, 0.2, 0.5, and 1 cm respectively. In each case, the total width s=$|x_6-x_1|$ of the sense electrodes is 2.5 cm. It is evident that the dependence of capacitance $C_{AC}$ 32 on g is much weaker than it is for capacitance $C_{AB}$ 22.

Figure 10:
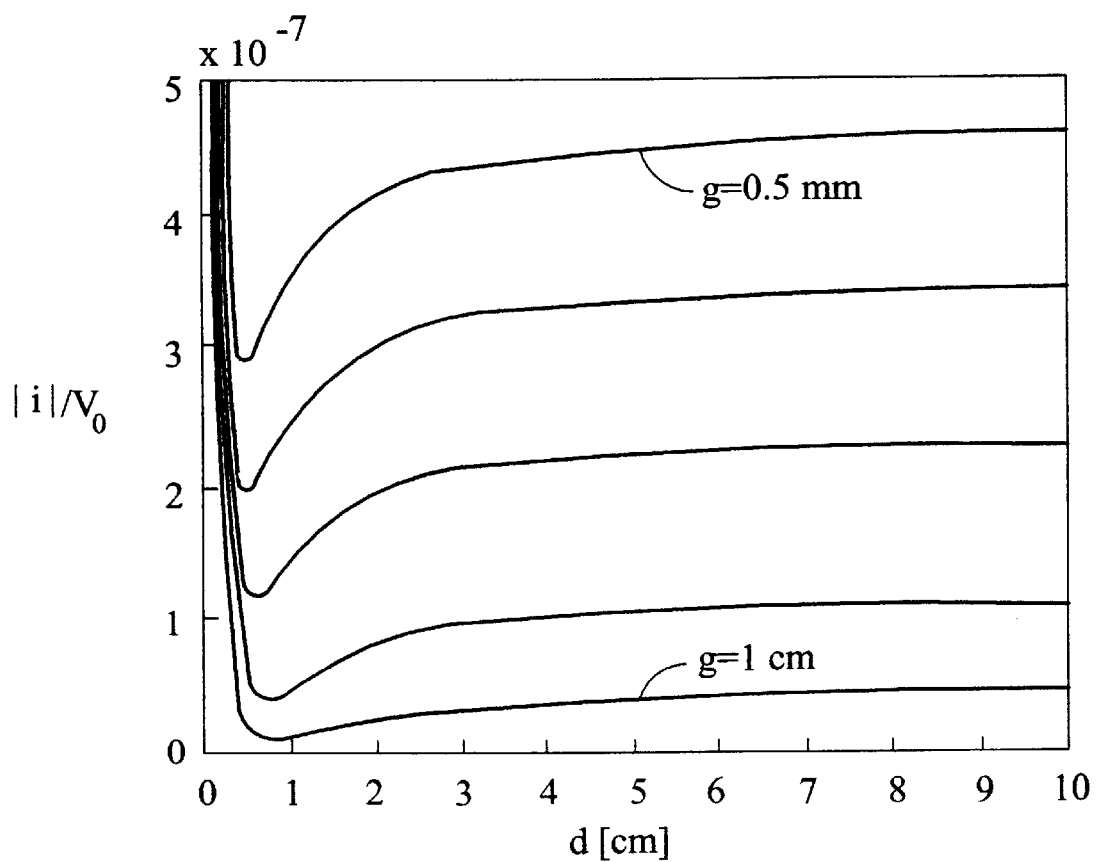
FIG. 10 shows a dependence of sensor response $|i|/V_0$ on d.

The calculation of dependence of sensor response $|i|/V_0$ on d, for g=0.05, 0.1, 0.2, 0.5, and 1.0 cm respectively is shown in FIG. 10. In each case, the sense electrodes are 1 m long and their total width s=2.5 cm. In other words, the calculated dependence of sensor response $|i|/V_0$ on d, from Eqs. (2), (3), and (28), is shown in FIG. 10.

It can be appreciated that electric field that passes through the volume in which sensing is to take place forms a desirable component of the electric field or flux for detection. On the other hand, the component of E that passes from the source electrode to the detection electrode without passing through the sensitive volume forms an undesirable component of the electric field or flux for detection in the instant invention. In other words, it would be desirous for the output of the circuitry to be insensitive to the component or flux of electric field that does not pass through the sensing volume. The circuitry should retain sensitivity to the component or flux of electric field passing through the sensitive volume, which is desirable for in the sensing system, thereby making it possible to detect a smaller relative change despite of the fact that the total electric field strength is weakened. In practice, a capacitive proximity sensor can be designed so that the sensitivity of the output to the approach of an object is limited not by electrical sensitivity but by the geometric stability of the electrodes. Consequently, improved performance is obtained by designing the electrode structure to limit the sensitive volume even if the absolute electrical sensitivity is reduced, as long as the relative sensitivity is improved.

Figure 11:
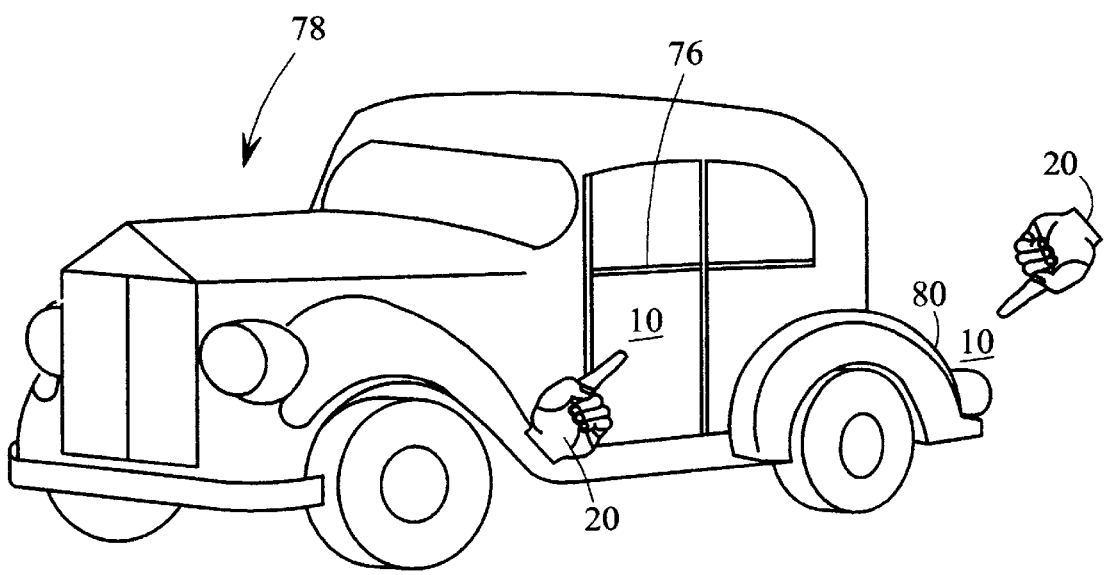
FIG. 11 shows a number of applications for an embodiment of the invention.

Referring to FIG. 11, a number of applications for the invention are shown. The capacitive proximity sensor 10 may be placed at a door 76 of a vehicle such as a car 78. In particular it can be used to improve the automatic control of a motorized door to detect an object or in the path of the closing door. Alternatively, the proximity sensor based on capacitance 10 may be placed about a trunk 80 of the car 78. In such an application, it could be used by a safety system for a motorized rear hatch, so that the hatch would automatically stop before contacting a person as it is closing. A foreign object such as a human body part that intrude as exemplified by the hand 20 may come into the proximity of a region such as the cube 46. The proximity sensor based on capacitance 10 will A sense the intrusion and convey suitable information to a controller (not shown).

A capacitive proximity sensor 10, intended to detect a person in a pinch zone such as the cube 46, may be used for only secondary pinch protection. For example, existing power door and hatch systems may already reopen automatically if there is mechanical contact with an obstacle while closing. An obstacle may be detected by monitoring a drive motor's load. The present invention is suitable for the proximity sensor 10 able to detect a person, or part of a person such as the hand 20, 1.5 to 2.5 cm above the sense electrode of the proximity sensor 10.

The sensor 10 of FIG. 1 is shown in FIG. 12 without the capacitances. The sensor 10 is used with an interface circuit depicted in FIGS. 13, 13A, 14a, 14b, 14c, 14d and 14e that include the synchronous detector 26. The approach of a person or the hand 20 of the person near the sensor 10 is detected by the resulting change in capacitance between two electrodes, i.e. the first electrode 12 and the second electrode 14. The electrodes are designed to maximize the relative change in capacitance for the desired proximity range, which includes the cube 46. The invention advances the art by improving detection of the relative change in capacitance, rather than the absolute change in capacitance. A grounded electrode is introduced to achieve this effect. It is noted that the relative change is more sensitive such that the sensor can be more efficiently used.

The circuit depicted in FIGS. 14a, 14b, 14c, 14d and 14e typically operates at frequencies in the range of 10 kHz to 100 kHz. Both the electrode and the circuit depicted in FIGS. 14a, 14b, 14c, 14d and 14e are well suited for on-vehicle use. The circuit depicted in FIGS. 14a, 14b, 14c, 14d and 14e may be implemented with off-the-shelf components.

Figure 13:
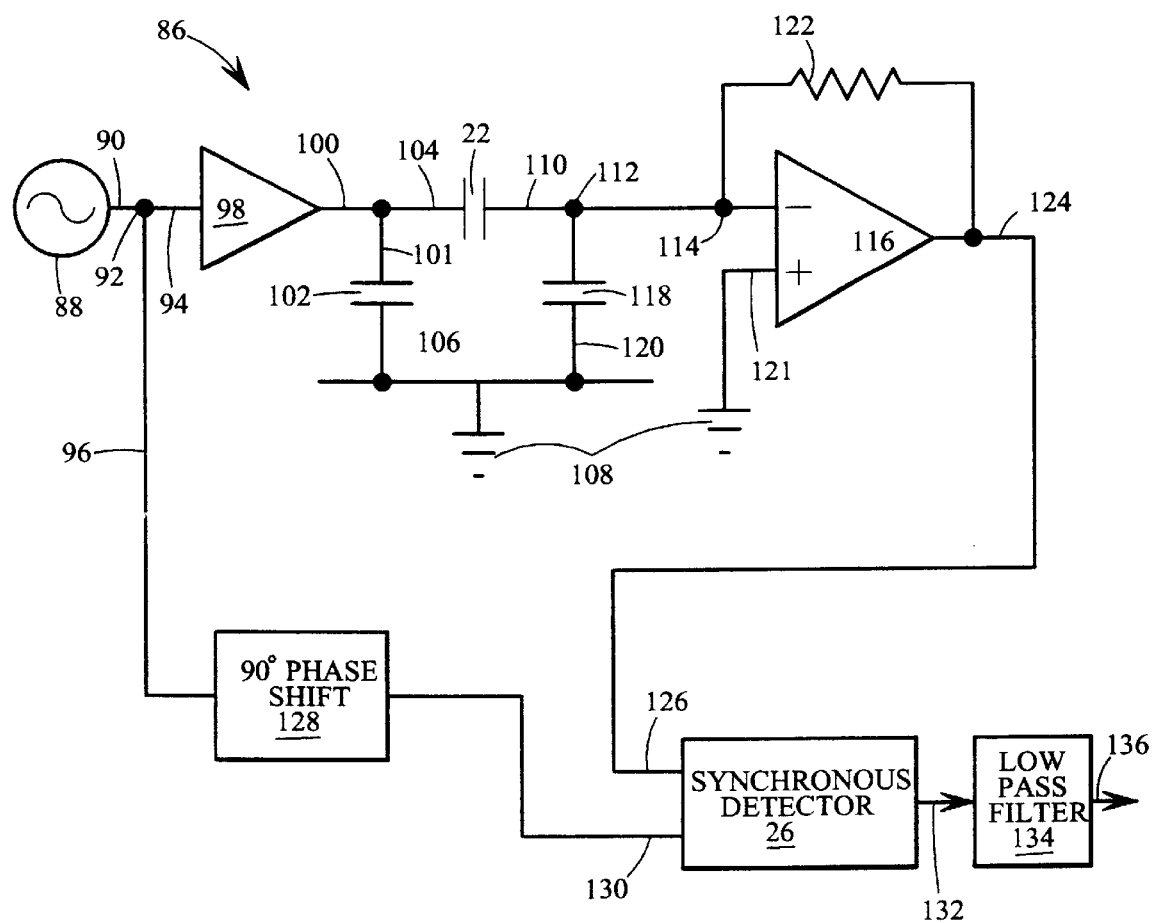
FIG. 13 shows a schematic of a circuit in an embodiment of the invention.
Figure 13A:
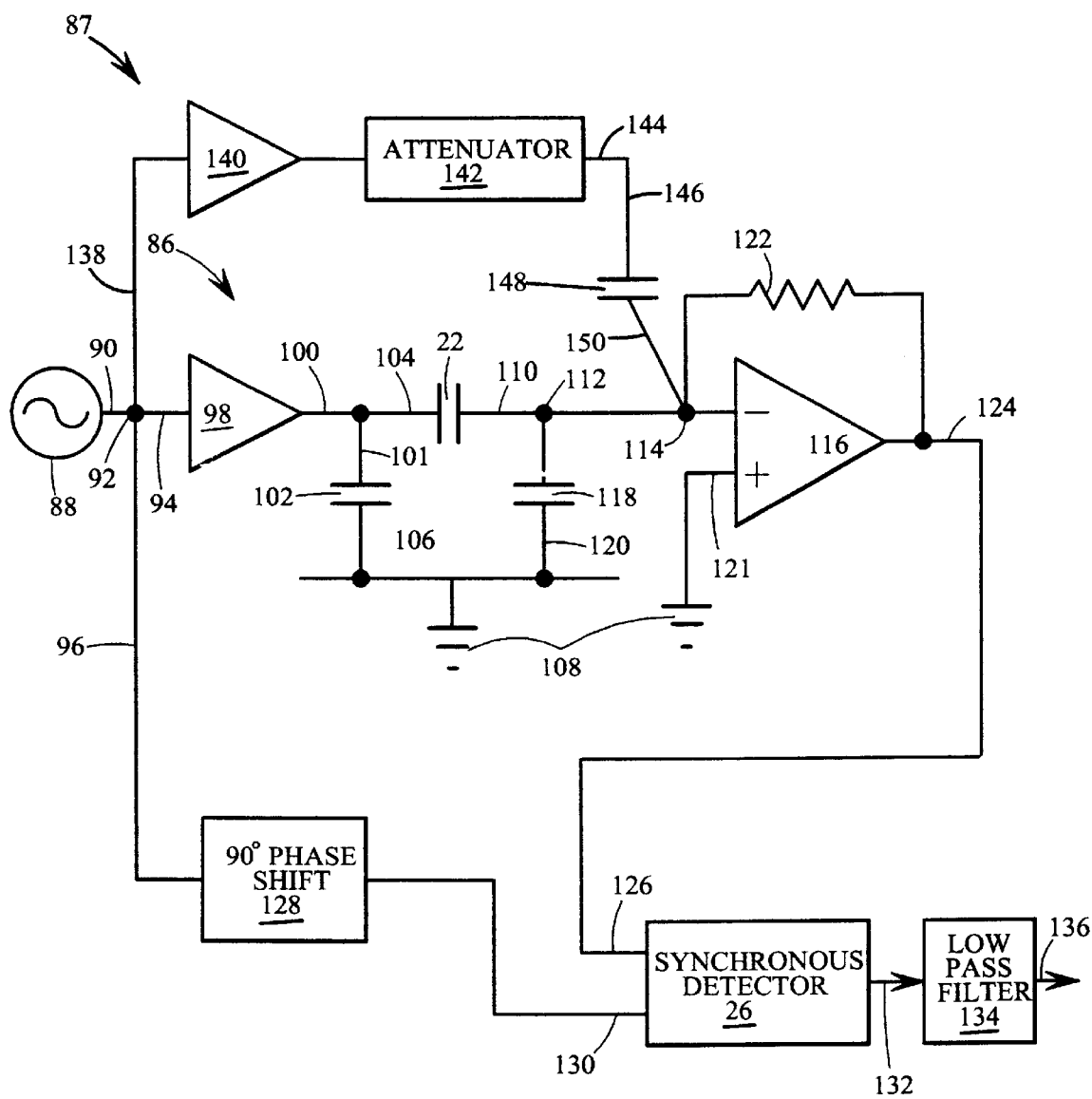
FIG. 13A depicts an improvement to the circuit described in FIG. 13.

Referring again to FIGS. 13, 13A, 14a, 14b, 14c, 14d and 14e, a schematic as well as a circuit to a component level are depicted. More specifically, FIGS. 13 and 13A show a set of schematics of the circuit structure. The AC source 88 generates a sine wave within the frequency range which passes through line 90. At point 92, the sine wave is split into a first branch 94 and a second branch 96. In the first branch 94, the sine wave acts as an input to a buffer amplifier 98 that has a low output impedance. An output 100 of the buffer amplifier 98 is virtually unaffected by changes in the shunt capacitance 102 that is independent of the capacitance $C_{AB}$ 22 of the first electrode 12. It is noted that shunt capacitance 102 includes a portion of the capacitance $C_{AC}$ 32, as well as other capacitances such as the capacitance between the center conductor of a coaxial cable and the shield of the cable that is independent of the capacitance $C_{AB}$ 22. In other words, the derived sine wave coming out of the buffer amplifier 98 is substantially applied upon a first end 104 of the capacitance $C_{AB}$ 22. Furthermore, the capacitance 102 has a second end that is connected to ground 108. The capacitance $C_{AB}$ 22 in turn has a second end 110 that is coupled to a point 112 of the second electrode 14. The point 112 is also coupled to a virtual ground 114 that is also an inverting input of an operational amplifier 116. The structure and function of a virtual ground is well known in the art. Therefore, it can be appreciated that there is virtually no current flowing through a second shunt capacitance 118, which has a first end 112 coupled to the virtual ground 114. The second shunt capacitance 118 has a second end 120 that is coupled to ground 108 as well. It is noted that the second capacitance 118 includes a portion of $C_{BC}$ 34, as well as other capacitances that are independent of the capacitance $C_{AB}$ 22. In other words, the derived sine wave current coming through $C_{AB}$ 22, which originates in the buffer amplifier 98 substantially traverses through the point 112 and then substantially flows toward the virtual ground 114. The non-inverting input 121 of the operational amplifier 116 is coupled to ground 108. A feedback resistance 122 is coupled between the virtual ground 114 and an output point 124 of the operational amplifier 116. The output point 124 of the operational amplifier 116 forms a first input 126 to the synchronous detector 26. Additional gain elements can be inserted between output 124 and input 126 to improve the sensitivity of the system.

The second branch 96 leads into a ninety-degree phase shifter 128 wherein the sine wave is transformed into a square wave that has a ninety-degree phase shift relative to the sine wave. The square wave forms a second input 130 to the synchronous detector 26 which serves as a reference input. The synchronous detector 26 generates an output 132 that further passes through a low pass filter 134 wherein undesirable high frequency noise is filtered out. An output 136 of the low pass filter 134 may be utilized for an indication of change of $C_{AB}$ 22.

The operation and function of the circuit 86 may be described as follows. The circuit 86 comprises a sine wave oscillator 88 which serves as AC source 24, and is coupled to electrode 12 through a buffer amplifier 98. The resultant current flowing through $C_{AB}$ 22 is collected by the operational amplifier 116, which is in a current-to-voltage conversion mode with its inverting input 114 at virtual ground. Current generated by shunt capacitance 102 goes to ground 108. This necessarily means that the current generated by shunt capacitance 102 does not contribute to the collected or resultant current flowing through $C_{AB}$ 22. Furthermore, second shunt capacitance 118 does not contribute to the collected current either, because it is effectively shorted out by the inverting input 114 of the operational amplifier 116. It is noted that the resultant current flowing through capacitance $C_{AB}$ 22 is ninety degrees out of phase with the sine wave oscillator 88. This fact is used to aid in a detection process whereby the synchronous detector 26 receives a reference that is also shifted ninety degrees. In other words, the second input 130 is shifted ninety degrees relative to the sine wave generator 88. In addition, the fact that any leakage current resulting from electrode 12 to electrode 14 is not phase shifted causes the detection process to reject the leakage current. In other words, the synchronous detector 26 acts as a filtering device wherein non-synchronous elements are filtered away thereby not contributing to the output 132. Furthermore, the low pass filter 134 removes residual noise that is still included in the output 132 and creates the output 136 that is analog in nature, which is proportional to a change in a differential capacitance such as the $C_{AB}$ 22. The circuit depicted in FIGS. 14a, 14b, 14c, 14d and 14e is able to detect changes in capacitance as small as 1 femtofarad using hundreds of picofarads for shunt capacitance, i.e. C1 102 and C2 118.

Referring now to FIG. 13A, an alternative circuit 87 to the circuit 86 is depicted. The alternative circuit 87 is achieved by way of adding a nulling signal through a capacitor 148 into the summing junction, which includes the inverting input 114 of the operational amplifier 116. The nulling signal is generated by inverting (i.e., 180 degree shift) as well as attenuating the sine wave from reference oscillator 88. Line 90 may further branch out into a third branch 138 wherein the sine wave is input into an inverter 140 and then into an attenuator 142 that extracts a sequence 144 of a desired portion of the sine wave. The sequence 144 is further applied upon a first end 146 of the capacitor 148. The capacitor has a second end 150 coupled to the inverting input 114 of the operational amplifier 116.

The operation and function of the alternative circuit 87 is as follows. The alternative circuit 87 provides for greater reduction of the size of the signal present due to a fixed part of capacitance $C_{AB}$ 22. The fixed part of capacitance $C_{AB}$ 22 is typically a few picofarads. The fixed part of capacitance $C_{AB}$ 22 would produce a sine wave signal of hundreds of millivolts at the output 124 of the operational amplifier 116 such as a Bi-FET OP-AMP. The fixed part of capacitance $C_{AB}$ 22 limits the amount of gain that can be placed between it and the synchronous detector 26. One solution is to introduce an inverted sine wave signal and apply the inverted signal through the capacitor 148 with a value, for example, 4.7 picofarad, to the inverting input 114 of the operational amplifier 116. The resulting current flow will cancel the current from the fixed part of capacitance $C_{AB}$ 22 when the attenuator 142 is adjusted properly. Therefore, additional gain stages can be added between the operational amplifier 116 and the synchronous detector 26. This results in an improvement of the sensitivity of the circuit 87.

Figure 14A:
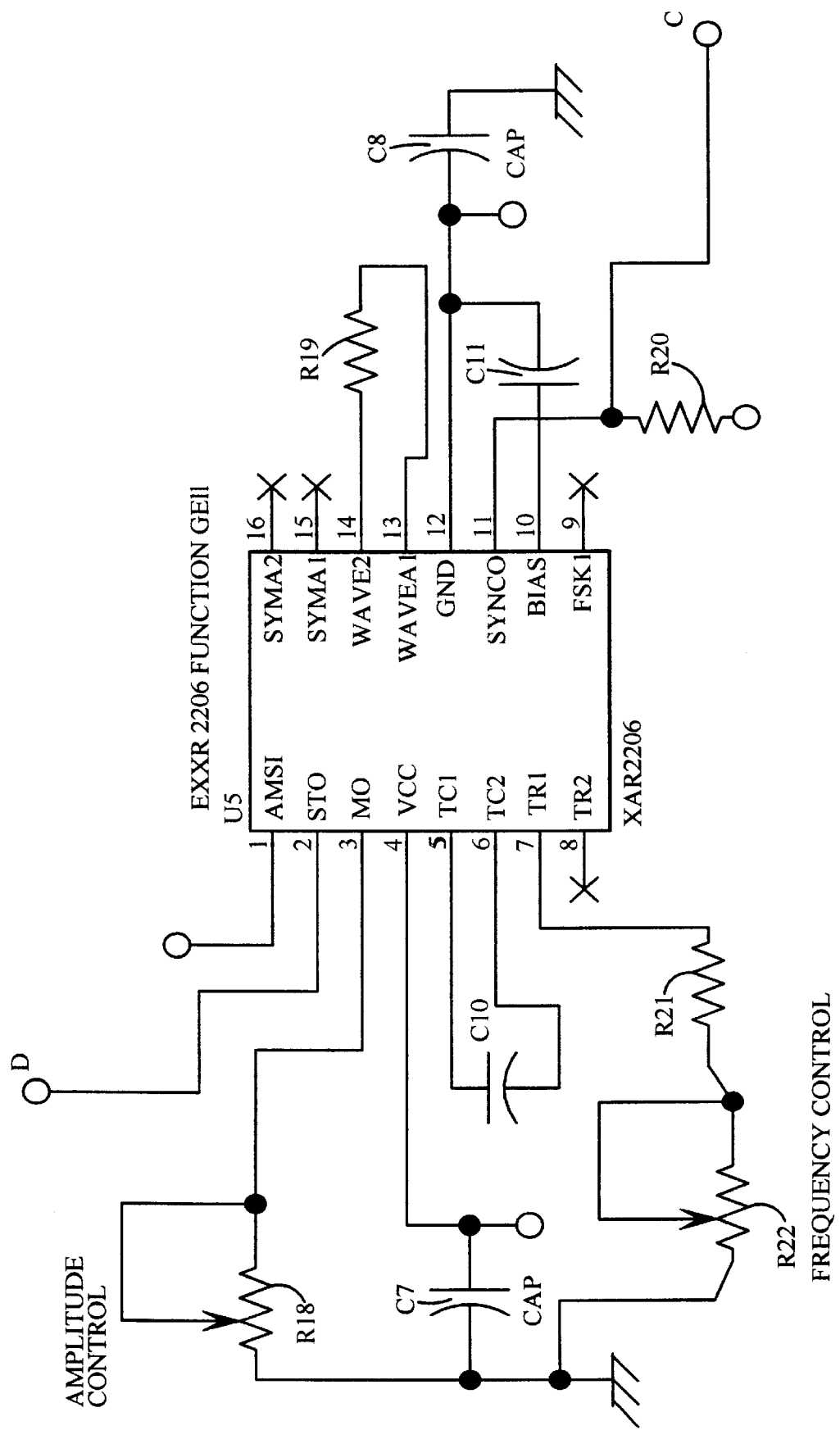
FIG. 14a shows, in part, a signal generator.
Figure 14B:
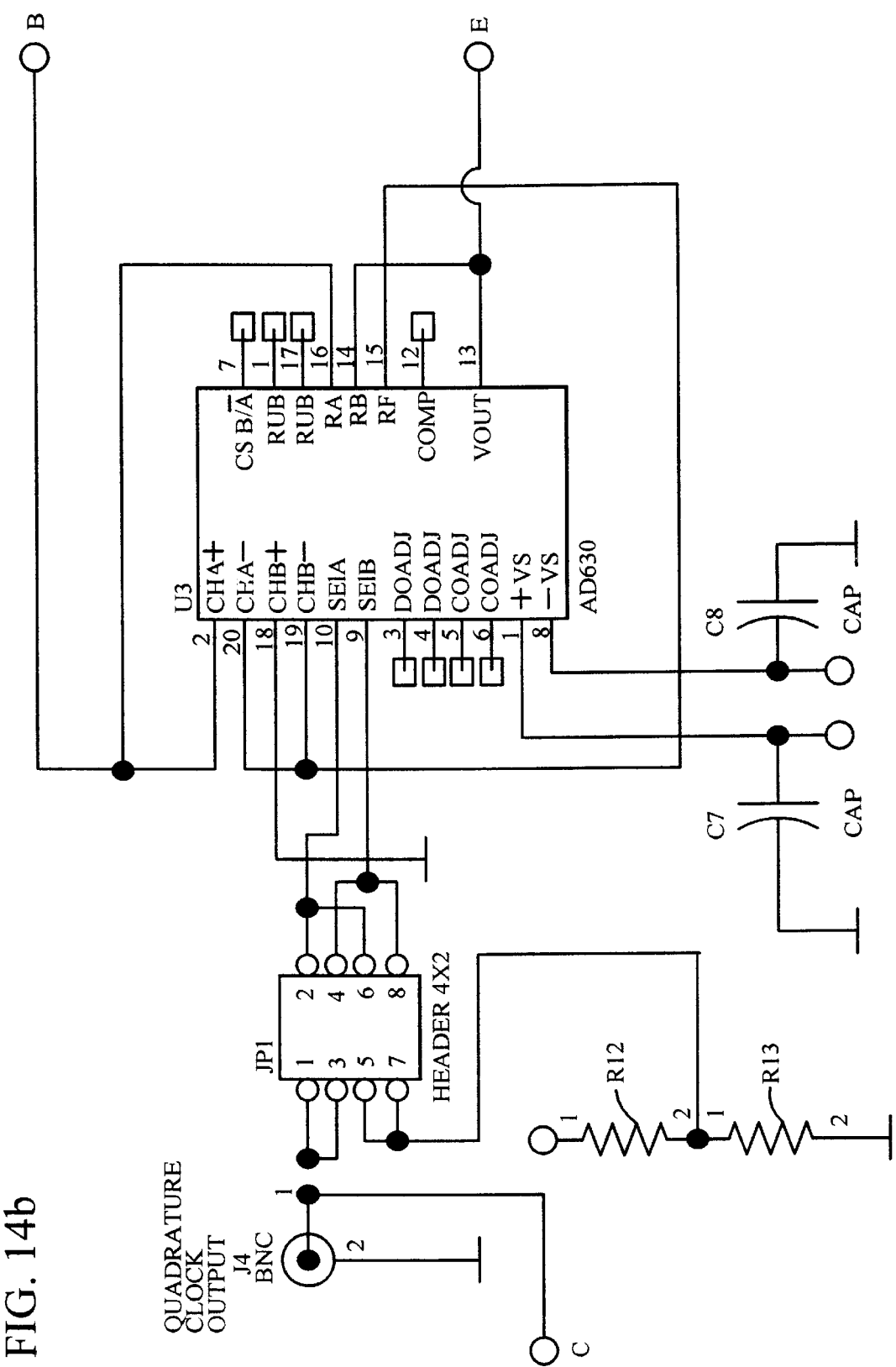
FIG. 14b shows, in part, a synchronous detector.
Figure 14C:
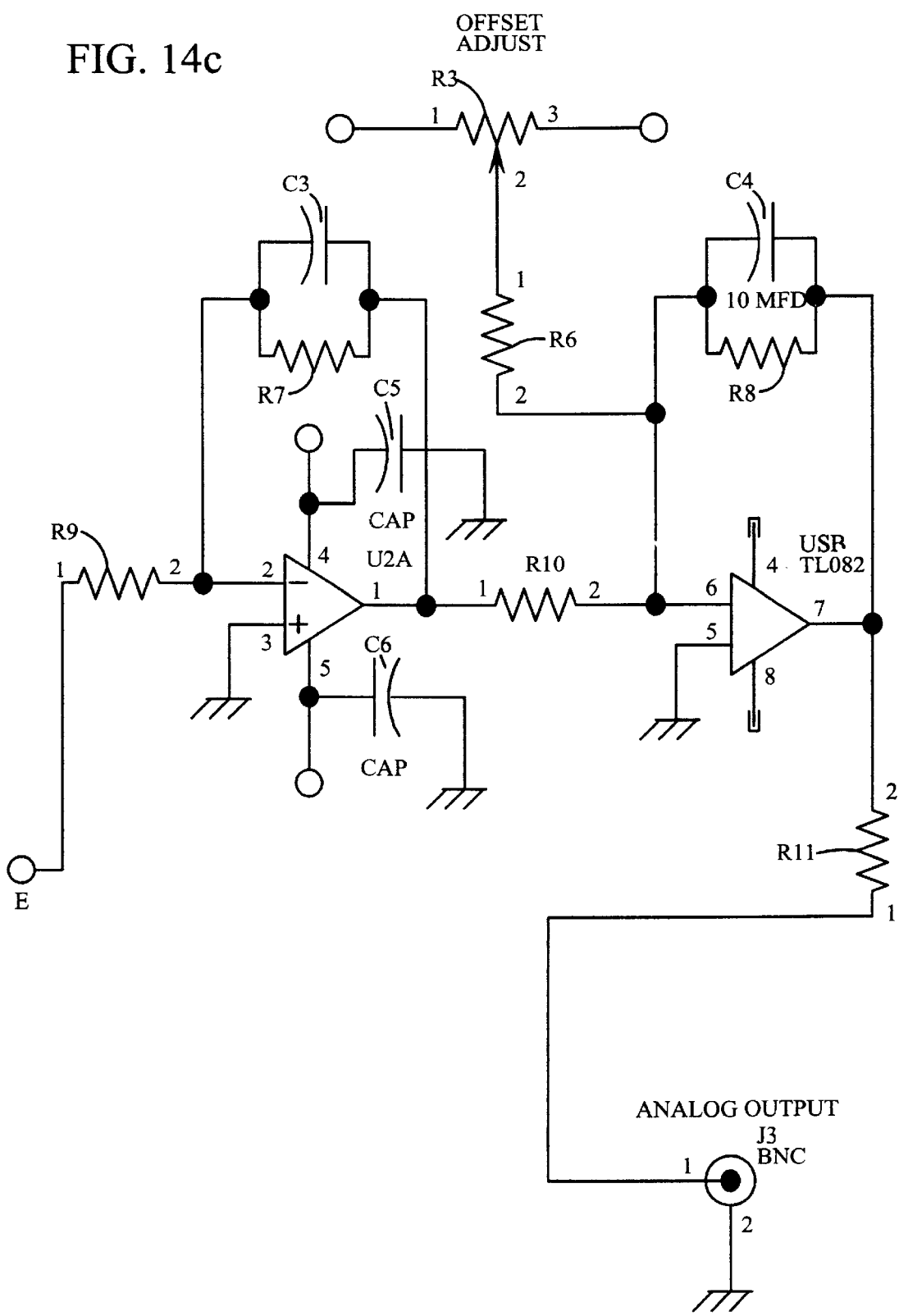
FIG. 14c shows, in part, a low pass filter.

By way of an example, FIGS. 14a, 14b, 14c, 14d and 14e depict the alternative circuit 87 to a component level. FIG. 14a depicts a function generator performing the equivalent of sine wave generator 88 or the AC source 24. One exception to FIG. 14a is that instead of using the ninety-degree shifter 124, an EXAR 2206 function generator is used for both the generation of the sine wave and the generation of a square wave that is ninety degrees shifted. FIG. 14b depicts a circuit that includes an equivalent circuit of the synchronous detector 26. Connection "C" denotes the input line 130 and connection "B" denotes input line 126. Furthermore, connection "E" denotes the input lead 132 to the low pass filter 134. The structure of the low pass filter 134 is shown in FIG. 14c.

Figure 14D:
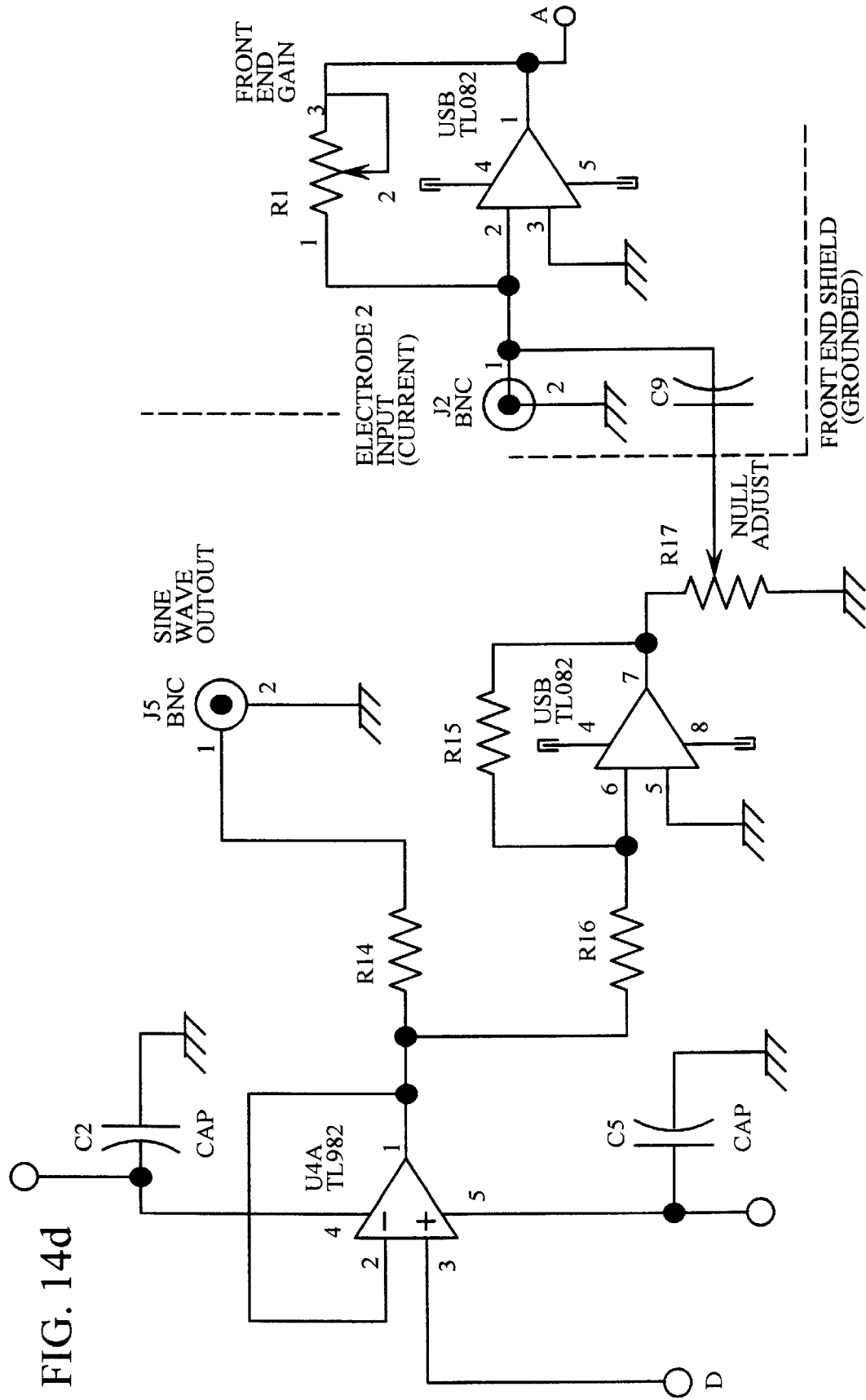
FIG. 14d shows, in part, an inverter as well as an attenuator.
Figure 14E:
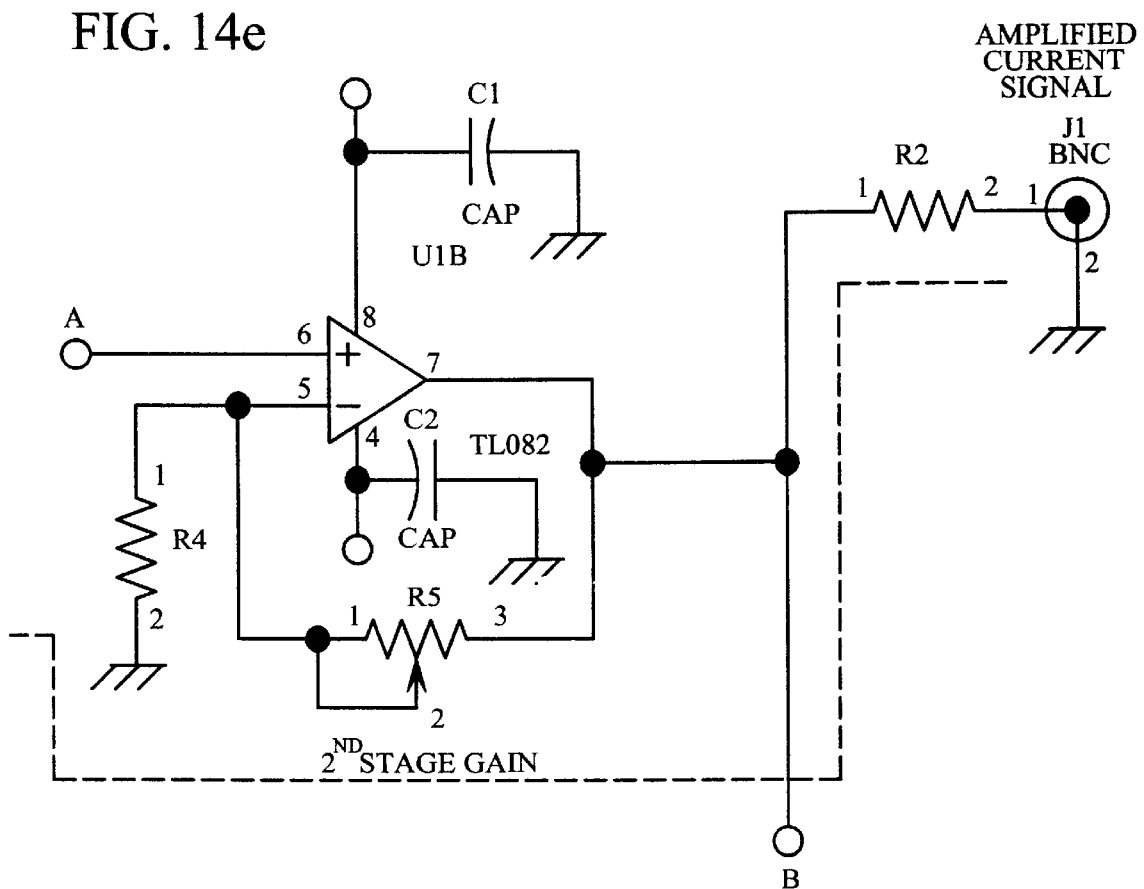
FIG. 14e shows, in part, an extension of an equivalent of the operational amplifier.

FIG. 14d depicts components for generating the sine wave at terminal J5, which is an equivalent of the output point 100. The attenuator 142 is achieved through variable resistor R17. The function of the inverter 140 is performed by amplifier U4B. Capacitance C9 is equivalent to the capacitor 148. The input 2 of U1A is an equivalent of the inverting input 114. Furthermore, FIG. 14e depicts the details of amplifier 116.

Figure 15:
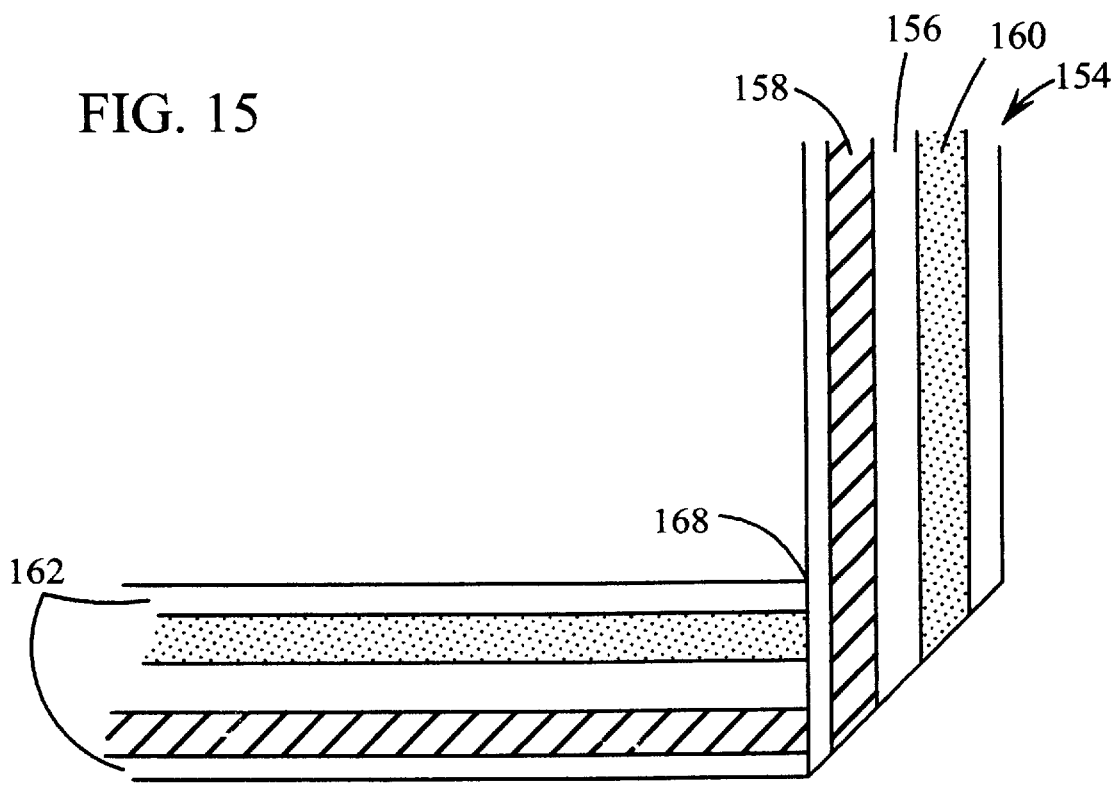
FIGS. 15 and 16 depict an example of a sensor for an embodiment of the invention.
Figure 16:
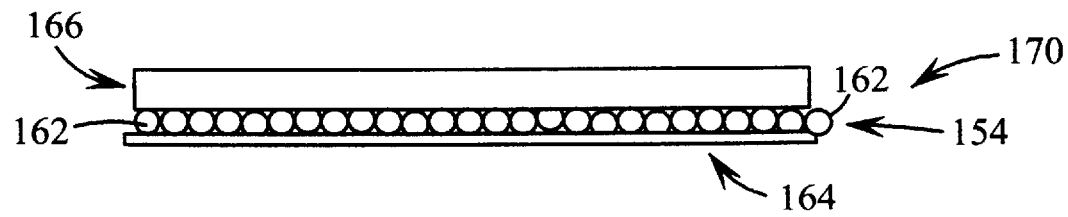
Figure 17:
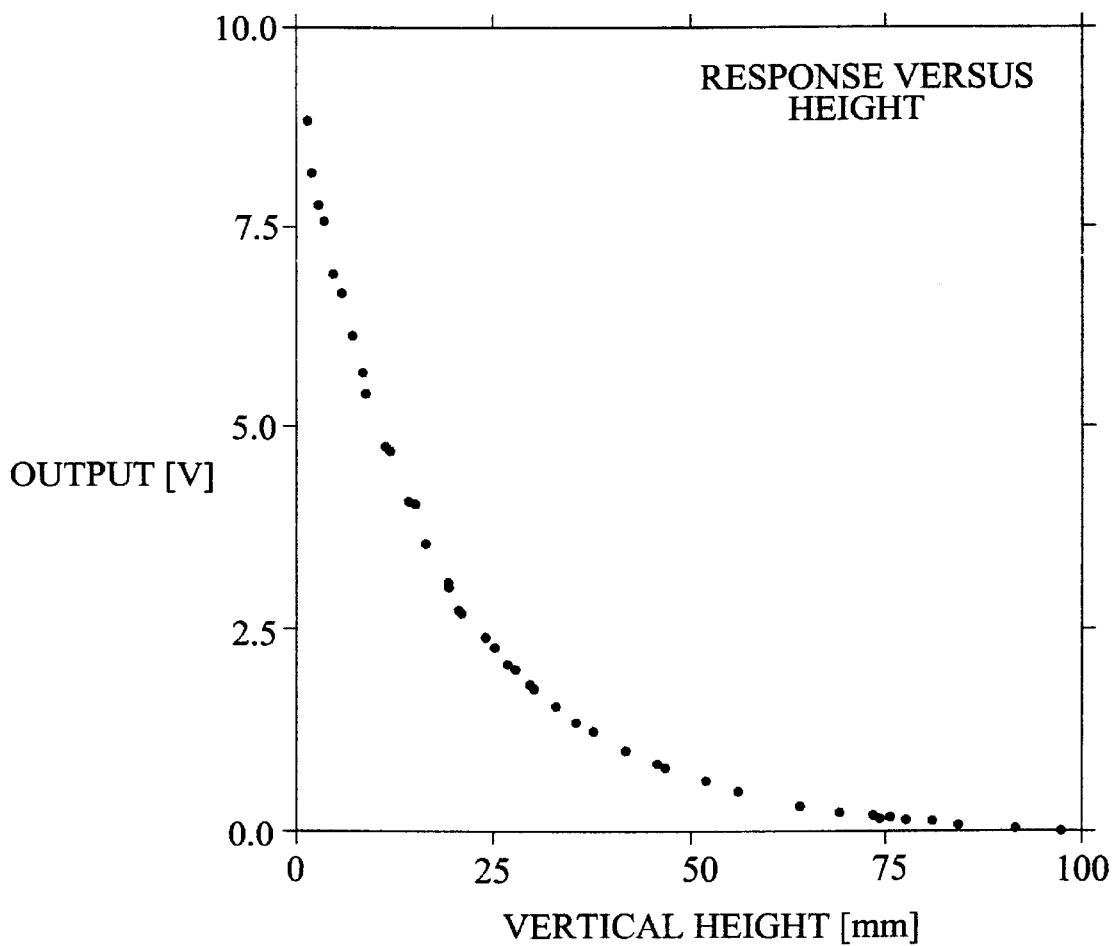
FIG. 17 is a plot of voltage versus distance to an object for an exemplary capacitive sensor.

Referring to FIGS. 15, 16 and 17, an example of the sensor 10 is depicted. As shown in FIGS. 15 and 16, a twenty-six-conductor ribbon cable 154, with a width of 3.8 cm, is used. The center six conductors 156 are electrically connected together to form the middle electrode 16. The two sets of 8 conductors 158 and 160 on each side are electrically connected together to form electrode 12 and electrode 14 respectively. In addition, the 2 outer conductors 162 on each side respectively are electrically connected together and grounded.

The ribbon cable 154 is backed with copper shim stock 164, about 74 micrometer thick and 3.8 cm wide. The ribbon cable 154 and the copper shim stock 164 are fastened together with a double-sided tape (not shown). The copper shim stock 164 is in turn attached to an object to be monitored (also not shown) with a double-sided tape 166. The top of the ribbon cable is covered with foam tape 166, which is 4.8 mm thick and 3.8 cm wide, with adhesive backing. The foam tape acts as the holding layer 18 depicted in FIG. 1 and FIG. 12. It prevents a person from approaching so close to the ribbon cable that the variation of output with distance depicted in FIG. 10 passes the minimum and begins to increase again with decreasing distance.

As can be appreciated, the measured 3-terminal capacitance decreases when a person's finger is brought near the capacitor structure. The 3-terminal capacitance of the structure is proportional to its length and is typically about 1.25 picofarad per meter. When a person's finger is placed close to the structure, the measured 3-terminal capacitance typically decreases by about 0.1 pF. The 3-terminal capacitance structure 170 can be brought around a corner 168 by folding the ribbon cable 154 over itself. An area of copper flashing is inserted inside the fold to shield electrodes 12 and 14 from one another where they are in close proximity. The shield is soldered to the copper shim stock backing, which is used as a ground plane. Alternatively, the shield could be electrically connected to one of the grounded wires in the ribbon cable, to some other wire that is grounded, or to grounded sheet metal beneath it. Thus, one ribbon cable 154 can be used for proximity protection around the perimeter of an aluminum plate with an area of 81×36 cm².

An example of the operation of the sensor is shown in FIG. 17. For this example, the 3-terminal capacitance 170 is measured using a General Radio 1615a capacitance bridge and a Princeton Applied Research 124a lock-in amplifier operating at 40 kHz. An analog signal from the lock-in that indicates a capacitive out-of-balance signal from the bridge is the output of the sensor 170. The sinusoidal voltage amplitude applied to first electrode 12 is about 4 Vrms, and the gain of the lock-in is set up so that a sinusoidal signal of 100 microvolts root mean square at 40 kHz from the bridge produces a 10 V DC output. A horizontal metal rod is lowered toward the 3-terminal electrode structure 10 shown in FIGS. 1 and 12, and the output of the lock-in was measured as a function of the distance of the metal rod above the electrode. The measured output from the lock-in versus vertical distance is shown in FIG. 17.

It will be understood that a person skilled in the art may make modifications to the preferred embodiment shown herein within the scope and intent of the claims. While the present invention has been described as carried out in a specific embodiment thereof, it is not intended to be limited thereby but intended to cover the invention broadly within the scope and spirit of the claims.

What is claimed is:

1. A capacitive sensor comprising:

a first electrode having at least one conducting surface being disposed for receiving an alternating current signal;

a second electrode having at least one conducting surface being disposed to generate an input signal for a detecting device;

a middle electrode having at least one conducting surface placed between said first electrode and said second electrode, said middle electrode being connected to a ground; and a holding material containing said at least one conducting surface of said middle electrode, said at least one conducting surface of said first electrode, and said at least one conducting surface of said second electrode;

a grounded metal surface greater in area then said first electrode, said middle electrode and said second electrode and positioned on a first side of said first electrode, said middle electrode and said second electrode;

said input signal varying in response to an object positioned proximate a second side of said first electrode, said middle electrode and said second electrode;

wherein said object comprises part of a human body.

2. The capacitive sensor of claim 1, wherein:

said holding material comprises a foam material.

3. The capacitive sensor of claim 1, wherein:

said first electrode, second electrode, and middle electrode all being flat conducting plates having predetermined thickness.

4. The capacitive sensor of claim 1, wherein:

said part of the human body comprises a hand.

5. The capacitive sensor of claim 1, wherein:

said grounded metal surface comprises a vehicle body plate.

6. The capacitive sensor of claim 1, wherein:

said input signal is indicative of a variation in a capacitance between said first electrode and said second electrode.

7. A capacitive sensor comprising:

a first electrode having at least one conducting surface being disposed for receiving an alternating current signal;

a second electrode having at least one conducting surface being disposed to generate an input signal for a detecting device;

a middle electrode having at least one conducting surface placed between said first electrode and said second electrode, said middle electrode being connected to a ground; and a holding material containing said at least one conducting surface of said middle electrode, said at least one conducting surface of said first electrode, and said at least one conducting surface of said second electrode wherein:

said first electrode generating a flux of electric field, said flux comprising a first portion flux and a second portion flux;

said middle electrode disposed to receive said second position flux, said second portion flux passing substantially through said holding material;

said second electrode disposed to receive said first portion flux.

8. The capacitive sensor of claim 7, wherein:

said first portion flux comprising substantially only the flux which passes through a predetermined volume for utilization of proximity sensing.

9. The capacitive sensor of claim 7, wherein:

said second portion flux comprises substantially flux which does not exit the holding material.

10. A capacitive proximity sensing system, comprising:

a first electrode having at least one conducting surface being disposed for receiving an alternating current signal;

a second electrode having at least one conducting surface being disposed to generate an input signal;

a middle electrode having at least one conducting surface placed between said first electrode and said second electrode, said middle electrode being connected to a ground; and a holding material containing said at least one conducting surface of said middle electrode, said at least one conducting surface of said first electrode, and said at least one conducting surface of said second electrode;

an oscillator coupled to said first electrode generating said alternating current signal; and a detector receiving said input signal whereby an output of said detector being representative of a capacitance between said first electrode and said second electrode;

a grounded metal surface greater in area then said first electrode, said middle electrode and said second electrode and positioned on a first side of said first electrode, said middle electrode and said second electrode;

said input signal varying in response to an object positioned proximate a second side of said first electrode, said middle electrode and said second electrode;

wherein said object comprises part of a human body.

11. The capacitive proximity sensing system of claim 10, wherein:

said holding material comprises a foam material.

12. The capacitive proximity sensing system of claim 10, wherein:

said first electrode, second electrode, and middle electrode all being flat conducting plates having predetermined thickness.

13. The capacitive proximity sensing system of claim 10, wherein:

said part of the human body comprises a hand.

14. The capacitive proximity sensing system of claim 10, wherein:

said grounded metal surface comprises a vehicle body plate.

15. The capacitive proximity sensing system of claim 10, wherein:

said input signal is indicative of a variation in a capacitance between said first electrode and said second electrode.

16. A capacitive proximity sensing system, comprising:

a first electrode having at least one conducting surface being disposed for receiving an alternating current signal;

a second electrode having at least one conducting surface being disposed to generate an input signal;

a middle electrode having at least one conducting surface placed between said first electrode and said second electrode, said middle electrode being connected to a ground; and a holding material containing said at least one conducting surface of said middle electrode, said at least one conducting surface of said first electrode, and said at least one conducting surface of said second electrode;

an oscillator coupled to said first electrode generating said alternating current signal; and a detector receiving said input signal whereby an output of said detector being representative of a capacitance between said first electrode and said second electrode wherein:

said first electrode generates a flux of electric field, said flux comprising a first portion flux and a second portion flux;

said middle electrode disposed to receive said second portion flux, said second portion flux passing substantially through said holding material;

said second electrode disposed to receive said first portion flux.

17. The capacitive proximity sensing system of claim 16, wherein:

said first portion flux comprising substantially only the flux which passes through a predetermined volume for utilization of proximity sensing.

18. The capacitive proximity sensing system of claim 16, wherein:

said second portion flux comprises substantially flux which does not exit the holding material.

* * * * *